United States Patent
Thomson et al.

(10) Patent No.: US 11,652,107 B2
(45) Date of Patent: May 16, 2023

(54) SUBSTRATE-LESS FINFET DIODE ARCHITECTURES WITH BACKSIDE METAL CONTACT AND SUBFIN REGIONS

(71) Applicant: Intel Corporation, Santa Clara, CA (US)

(72) Inventors: Nicholas Thomson, Hillsboro, OR (US); Ayan Kar, Portland, OR (US); Kalyan Kolluru, Portland, OR (US); Nathan Jack, Forest Grove, OR (US); Rui Ma, Portland, OR (US); Mark Bohr, Aloha, OR (US); Rishabh Mehandru, Portland, OR (US); Halady Arpit Rao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 815 days.

(21) Appl. No.: 16/447,874

(22) Filed: Jun. 20, 2019

(65) Prior Publication Data

US 2020/0403007 A1    Dec. 24, 2020

(51) Int. Cl.
*H01L 29/06* (2006.01)
*H01L 27/12* (2006.01)
(Continued)

(52) U.S. Cl.
CPC .......... *H01L 27/1203* (2013.01); *H01L 21/84* (2013.01); *H01L 27/0255* (2013.01); *H01L 27/1211* (2013.01); *H01L 29/8613* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/785; H01L 2029/7858;
(Continued)

(56) References Cited

U.S. PATENT DOCUMENTS

| | | | |
|---|---|---|---|
| 2016/0086950 A1* | 3/2016 | Eom ................ | H01L 21/76897 257/192 |
| 2016/0163700 A1* | 6/2016 | Peng .................... | H01L 21/845 257/401 |
| 2022/0077138 A1* | 3/2022 | Okubo ................. | H01L 21/822 |

OTHER PUBLICATIONS

Chen et al., VFTLP Characteristics of ESD Protection Diodes in Advanced Bulk FinFET Technology, 2017, IEEE, IEEE Microwave and Wireless Components Letters (vol. 27, Issue 2), pp. 147-149 (Year: 2017) (Year: 2017).*

* cited by examiner

*Primary Examiner* — Samuel Park
(74) *Attorney, Agent, or Firm* — Schwabe, Williamson & Wyatt, P.C.

(57) ABSTRACT

Embodiments include diode devices and transistor devices. A diode device includes a first fin region over a first conductive region and an insulator region, and a second fin region over a second conductive and insulator regions, where the second fin region is laterally adjacent to the first fin region, and the insulator region is between the first and second conductive regions. The diode device includes a first conductive via on the first conductive region, where the first conductive via is vertically adjacent to the first fin region, and a second conductive via on the second conductive region, where the second conductive via is vertically adjacent to the second fin region. The diode device may include conductive contacts, first portions on the first fin region, second portions on the second fin region, and gate electrodes (Continued)

between the first and second portions and the conductive contacts.

10 Claims, 17 Drawing Sheets

(51) Int. Cl.
    *H01L 27/02*          (2006.01)
    *H01L 21/84*          (2006.01)
    *H01L 29/861*        (2006.01)

(58) Field of Classification Search
    CPC ..... H01L 2924/13067; H01L 29/66818; H01L 29/7856; H01L 23/5384; H01L 21/76897; H01L 23/5381; H01L 23/5386; H01L 24/06; H01L 24/13; H01L 24/16; H01L 25/0655; H01L 23/49816; H01L 23/5383; H01L 24/81; H01L 2224/16238; H01L 2224/81192; H01L 2924/15331; H01L 23/5385; H01L 23/49822; H01L 21/4853; H01L 21/4857; H01L 21/486; H01L 23/49811; H01L 23/49827; H01L 2224/16148; H01L 2224/16165; H05K 1/181

See application file for complete search history.

SUBSTRATE-LESS FINFET DIODE ARCHITECTURES WITH BACKSIDE METAL CONTACT AND SUBFIN REGIONS

FIELD

Embodiments relate to electronic structures and processing. More particularly, the embodiments relate to electronic structures with substrate-less FinFET diode architectures with backside metal contacts and subfin regions.

BACKGROUND

For the past several decades, the scaling of features in integrated circuit (IC) devices has been a driving force behind an ever-growing semiconductor industry. Scaling to smaller and smaller features enables increased densities of functional units on the limited space of semiconductor chips. For example, shrinking transistor/diode size allows for the incorporation of an increased number of memory devices on a chip, lending to the fabrication of products with increased capacity. The drive for ever-more capacity, however, is not without issue. The necessity to optimize the performance of each device becomes increasingly significant.

IC diodes, such as metal oxide semiconductor (MOS) diode devices typically used in a complementary metal oxide semiconductor (CMOS), typically rely on a silicon substrate to provide a current path from an anode region to a cathode region. The drive to scale ICs, however, has recently been obtained by removing the silicon substrate that provides the current path for such diodes. Accordingly, in the existing substrate-less technologies such as silicon-on-insulator (SOI) devices, the bulk of silicon can be removed completely by leaving fins on top of an insulator. The electrostatic discharge (ESD) current in these SOI devices is thus typically contained within the fins as the ESD current flows from the anode region to the cathode region.

Large ESD currents result in extreme temperatures within the diodes that ultimately lead to failures. In traditional bulk diodes, a shallow trench isolation (STI) forms the separation between the anode and cathode regions, causing the current path to travel into the substrate where the heat generated has a large volume in which to dissipate. In traditional SOI diodes, current flow, and thus heat generation, occurs in the fins that have a much smaller volume. Further, the insulator beneath the fins insulates against heat dissipation, leading to thermal failures at much lower current densities.

As such, to achieve a similar level of ESD protection, additional SOI diodes would be needed, thereby leading to larger area utilization, higher capacitive loading, and more static power dissipation due to reverse-bias leakage currents. Additionally, since SOI diodes rely on poly gates to separate the anode and cathode regions, some transistor leakage mechanisms, such as sub-threshold current mechanisms will apply. These leakage mechanisms are usually orders of magnitude higher than the reverse biased P/N junction leakage mechanisms resulting in a substantial increase in leakage current further increasing static power dissipation.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
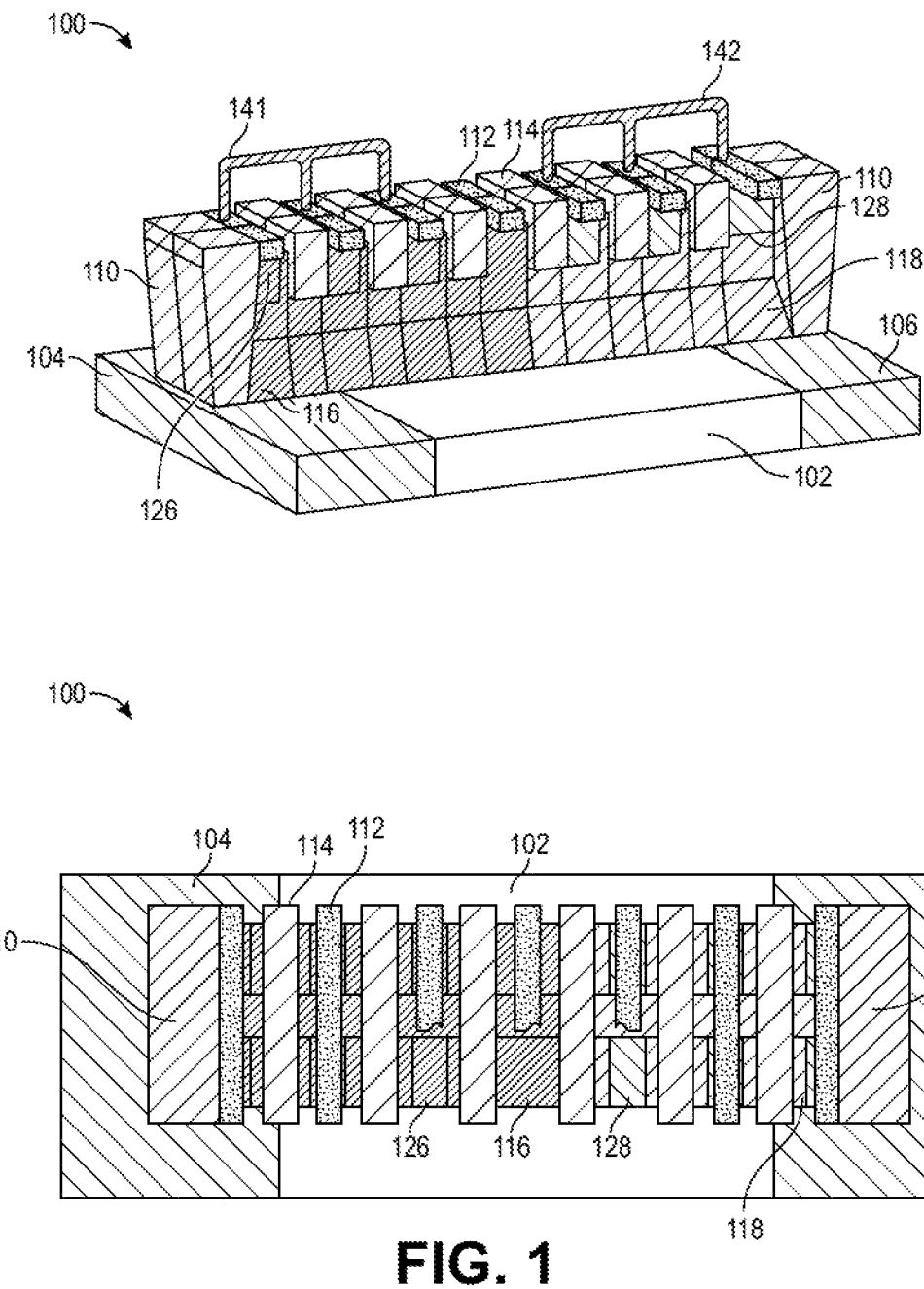
FIG. 1 is an illustration of a cross-sectional view and a respective plan view of a lateral diode with an N-type fin region, a P-type fin region, and a plurality of backside vias, where the plurality of backside vias are positioned on the outer edges of the respective N-type and P-type fin regions, according to one embodiment.

Described herein are electronic structures with substrate-less FinFET diodes and methods of forming such electronic structures. The electronic structures (or semiconductor packages) described below and methods of forming such electronic structures include a substrate-less FinFET diode (or a substrate-less FinFET on-die diode) with subfin regions/portions (e.g., N-type/P-type subfin regions), fin regions/portions (e.g., N-type/P-type epitaxially grown portions), and backside vias, according to an embodiment. Additionally, in another embodiment, the electronic structures described below and methods of forming such electronic structures include a substrate-less three terminals bipolar junction transistor (BJT) (or a substrate-less FinFET bandgap diode) with subfin regions/portions (e.g., N-type/P-type subfin regions), fin regions/portions (e.g., N-type/P-type epitaxially grown portions), emitter/collector/base regions, and backside vias.

Embodiments of the substrate-less diodes described herein provide (i) subfin conduction paths that enable greater heat spreading, (ii) subfin regions with N-type/P-type dopants (or impurities) that may be epitaxially grown, implanted, and/or the like, and such doped subfin regions may be respectively disposed (or implemented/formed) below (or under/underneath) the doped epitaxially grown fin portions without a global/foundational substrate, and (iii) backside metal layers/vias that directly couple the bottoms of the subfin regions to the topside conductive contacts on the epitaxially grown fin portions.

Furthermore, the thermal benefits of these substrate-less diodes may be implemented by contacting the subfin (or the fin) regions directly with the backside conductive layer (or the backside metal) with good thermal conductivity. In these embodiments, the backside contact(s) and presence of subfin regions are leveraged to provide improved electrostatic discharge (ESD) protection and low-leakage alternatives to the existing lateral silicon-on-insulator (SOI) diodes (as described above).

Additionally, embodiments of the substrate-less diodes include improvements over existing processing technologies by implementing the subfin and backside metal contacts, which greatly increase the thermal limits and respectively the current carrying capabilities of these diodes. This also results in smaller area/space devoted to ESD protection, reduced capacitive loading of input/output (I/O) nets, and decreased static power dissipation through leakage current. The subfin regions also allow shallow isolation regions to substantially reduce leakage currents without cutting off the current path from the anode region to the cathode region. Furthermore, these embodiments of the substrate-less diodes enable routing the ESD current directly to large backside conductive layers with a simplified ESD design, which reduces the voltage drop and thus enables such diodes to more-effectively clamp voltages leading to more-robust ESD designs.

In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

As used herein, the terms metal interconnect(ing) layers, metal line, interconnect line, trace, wire, conductor, signal path, and signaling medium are all related and often used interchangeably. Furthermore, as used herein, a "metal layer" refers to a conductive layer that may include, but is not limited to, traces, wires, lines, interconnects, planes, and any other conductive formations. In some examples, the conductive/metal layer may be any suitable metal such as aluminum (Al), copper (Cu), and/or an alloy of Al and Cu, that are used as conductors to provide signal paths for coupling or interconnecting, electrical circuitry. In addition, the metal layer may include a metal trace (or a metal line/plane/pad) and a via that is coupled to the metal trace, where the via (or contact) may refer to a conductive interconnect/structure used to electrically couple/connect conductors, such as metal traces, from different metal/interconnect levels.

These complementary metal-oxide-semiconductor (CMOS) devices described herein may be implemented in one or more components associated with an IC and/or between various such components. As described herein, the terms chip, IC, monolithic device, semiconductor device, semiconductor package, and microelectronic device, are often used interchangeably in the semiconductor packaging field, and thus the embodiments described herein may be applicable to all of the above as known in this field. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device with substrate-less diodes (e.g., a lateral diode, a lateral dual-polarity diode, a vertical diode, a STI dual-polarity diode, etc.) and/or transistors (e.g., a lateral three terminal BJT, a shallow three terminal BJT, etc.) with N-type fin regions, P-type fin regions, backside vias, and/or parallel backside vias.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As noted above, conventional diodes, such as ESD diodes, rely on silicon substrates to provide a current path from anode to cathode. In substrate-less technology as diode devices continue to shrink, these semiconductor substrates and thus the current/conduction paths are removed. This creates a need for new and improved approaches to construct these diodes or the like (e.g., ESD diodes). Accordingly, the embodiments described below in FIGS. 1-7 include several diode devices/designs that leverage the benefits highlighted above, including ESD protection and/or the like. For example, the design of these diode devices shown in FIGS. 1-7 may enable that the resistance observed in the front-end diodes under ESD stress conditions and the total carried current observed in such diode devices before thermal failure (as both of these observed resistance and current measurements may be normalized by the exposed drawn diode diffusion area) to outperform the existing bulk diode devices and/or the like.

The embodiments illustrated below in FIGS. 1-7 represent different approaches in which the highlighted advantages/benefits may be utilized to create the ESD substrate-less FinFET diode devices with subfin/fin regions and backside metal contacts, such as the backside metal regions of the cathode and anode, and backside vias and/or parallel backside vias. In the embodiments of FIGS. 1-7, two-fin diode devices are shown, however the number of fins (or fin/subfin regions) may be increased/expanded (i.e., increased to more than 2 fins) to improve the area efficiency of such diode device. Likewise, the number of adjacent backside metal contacts, the space between such contacts, the number of fin-cut backside vias, and/or the length of parallel backside vias may be varied (or increased/decreased)—without changing the inherent design—in the diode devices of FIGS. 1-7. Also, the performance of the diode devices described below in FIGS. 1-7 may be modulated (or optimized) (i) by changing the background doping species/concentration/energy of the fins and/or the epitaxially grown portions of the fins, and (ii) by changing the species and concentration of the doping in the fins to thus invert the polarity of the fin (e.g., as may be implemented with the lateral diode devices of FIGS. 1-2). An example of such an embodiment is shown in each of FIGS. 1-7. Note that in the embodiments described below a diode device may be shown, where such illustrated diode device may be a small portion of a larger full array of diode devices.

Figure 2:
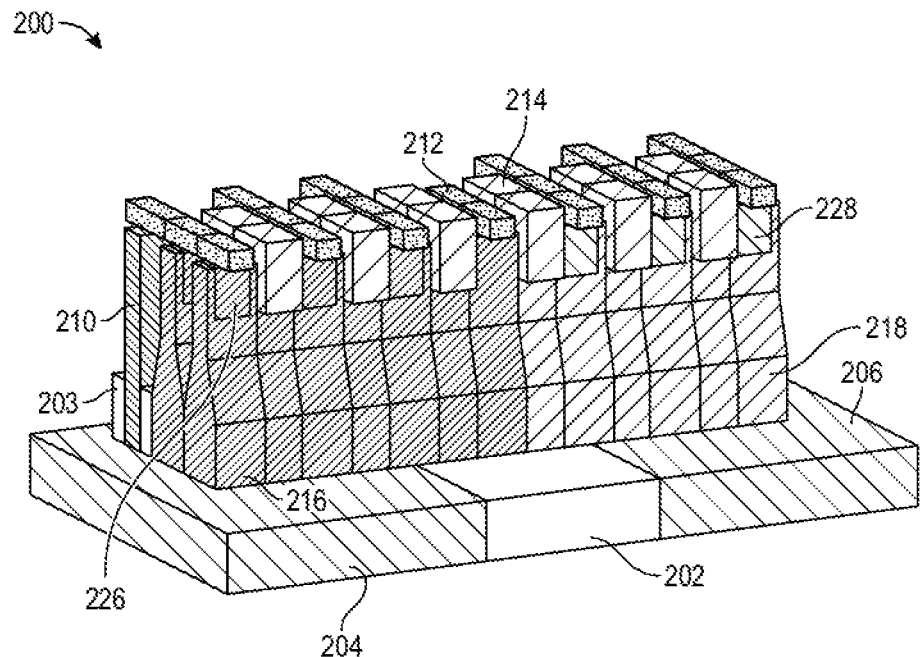
FIG. 2 is an illustration of a cross-sectional view and a respective plan view of a lateral diode with an N-type fin region, a P-type fin region, and a plurality of parallel backside vias, where the plurality of parallel backside vias are positioned in parallel to the respective N-type and P-type fin regions, according to one embodiment.
Figure 2:
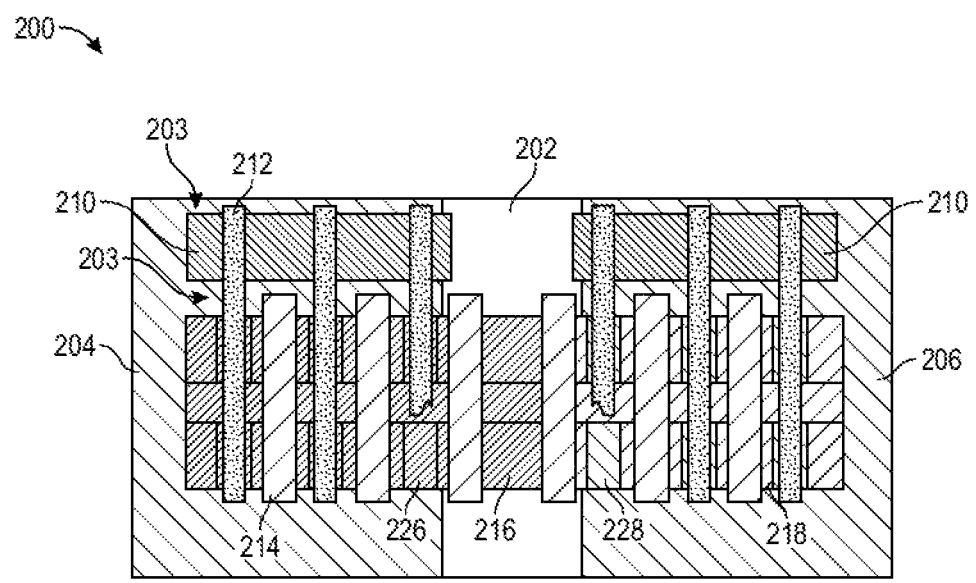

FIGS. 1-2 illustrate approaches to implement lateral diode devices including subfin conduction with backside vias and/or parallel backside vias. Initially, the lateral diode device described below may have an N-type fin region (or N-type fins) that is grown, and then a P-type fin region (or P-type fins) may be implanted underneath P-type epitaxially (epi) grown portions. Without this P-type fin region implant, the backside metals of the anode and cathode regions would short through the N-type fin region, and the P-type epi grown portions (or the P-epi portions of the anode) would short to the N-type fin region through a backside via. Additionally, the P/N diode junction may be formed at the interface of the N-type fins and the implanted P-type fins, while grown N-type/P-type epi portions may form the contacts between topside metal contacts and the respective N-type/P-type fins. Lastly, topside routing (or routing lines) may couple the topside metal contacts together, and backside vias may thus cut the respective N-type/P-type fin regions and create a connection between the respective topside epi portions and the backside metals of the anode and cathode regions. FIG. 2 illustrates a similar lateral diode using parallel backside vias. These parallel backside vias run parallel to the fin regions and may occupy space between groups of fins. In both embodiments, the backside metals of the anode and cathode regions contact the fin regions directly and may thus not run the length of the fin regions without creating a short between the anode and cathode region. The separation between the backside metal regions can be varied to trade off capacitance for thermal heat-sinking. Note that, in some views, portions of the fins, insulators, metals, and vias may have been removed in such devices for clarity.

Referring now to FIG. 1, a cross-sectional and respective top-view illustration of a diode device 100 is shown, in accordance with an embodiment. In one embodiment, the diode device 100 may be a substrate-less FinFET lateral diode with backside vias (i.e., a lateral FinFET diode design without a semiconductor substrate, a bulk of silicon layer, a SOI substrate, etc.). The diode device 100 may include an N-type fin region 116 and P-type fin region 118 that are disposed over a cathode region 104, an insulator region 102, and an anode region 106. For one embodiment, a plurality of N-type epitaxially (epi) grown portions 126 (hereinafter referred to as "N-type epi portions"), a plurality of gate electrodes 114, and a plurality of P-type epi grown portions 128 (hereinafter referred to as "P-type epi portions") that are disposed over the N-type fin region 116 and the P-type fin region 118, where each of the gate electrodes 114 is positioned (or disposed) between two of the N-type/P-type epi portions 126 and 128 (i.e., a gate electrode 114 between two N-type epi portions 126, two P-type epi portions 128, and/or one N-type epi portion 126 and one P-type epi portion 128).

In some embodiments, a plurality of conductive contacts 112 are disposed over the N-type/P-type epi portions 126 and 128 to form the topside conductive/metal contacts of the diode device 100. The conductive contacts 112 may be positioned between the gate electrodes 114 and/or between one gate electrode 114 and one of a plurality of backside vias 110. The backside vias 110 may be disposed vertically on the cathode region 104 and the anode region 106, where the backside vias 110 are positioned adjacent to the outer edges of the N-type/P-type fin regions 116 and 118.

As described above, in some embodiments, the diode device 100 may dispose the N-type fin region 116 over the insulator, cathode, and/or anode regions 102, 104, and 106, while the P-type fin region 118 may be implanted below (or under) the P-type epi portions 128 (e.g., as shown/described below in further detail in FIGS. 10A-10C). This implanted P-type fin region 118 may help conductively isolate the cathode region 104 from the anode region 106, and the P-type epi portions 128 from the cathode region 104. Additionally, in an embodiment, the diode device 100 may include a plurality of routing lines 141-142 to couple the topside conductive contacts 112 together, where, for example, the routing line 141 may be used to couple the conductive contacts 112 over the N-type fin region 116 to each other, and the routing line 142 may be used to couple the conductive contacts 112 over the P-type fin region 118 to each other.

In some embodiments, the diode device 100 may be a diode unit implemented from a transistor device (or a transistor block/array) or part of a transistor device. The diode device 100 may have portion(s) that may be omitted (or not shown) for purposes of clarity. In one embodiment, the diode device 100 may dispose the insulator region 102 between the cathode region 104 and the anode region 106. In one embodiment, the insulator region 102 may be an isolation region/portion/layer formed of an isolation material (or an electrically insulative material), which may include any suitable material that may isolate conductive semiconductor components (e.g., N-type/P-type fin regions, backside vias, etc.). That is, in some embodiments, the insulator region 102 may serve to cut and avoid a short between the backside (or backend) conductive (or metal) regions of the cathode 104 and the anode 106, thereby isolating the cathode region 104 and the anode region 106 within the lateral diode device 100. Also, in one embodiment, the insulator region 102 has a width that separates the cathode region 104 from the anode region 106, where the width of the insulator region 102 (i.e., the separation between the backside metal cathode and anode regions/segments) may be varied to trade-off capacitance for thermal heat-sinking for the diode device 100.

In some embodiments, the insulator region 102 may include glass, silicon dioxide, a dielectric, or the like. The dielectric may be any known dielectric material, such as low-k dielectric materials. Examples of dielectric materials that may be used include, but are not limited to, silicon oxide, carbon doped oxide (CDO), silicon nitride, organic polymers such as perfluorocyclobutane and/or polytetrafluoroethylene, fluorosilicate glass (FSG), and/or organosilicates, such as silsesquioxane, siloxane, and/or organosilicate glass.

As shown in FIG. 1, the cathode and anode regions 104 and 106 are disposed below the backside vias 110 and the N-type/P-type fin regions 116 and 118. In one embodiment, the cathode region 104 may be a backside conductive/metallic layer implemented as the cathode of the diode device 100, and the anode region 106 may be a backside conductive/metallic layer implemented as the anode of the diode device 100. For one embodiment, the cathode and anode regions 104 and 106 may include a conductive material, such as metal or the like.

In some embodiments, the diode device 100 may be implemented (or fabricated) using FinFET technology. Accordingly, as illustrated in FIG. 1, the diode device 100 includes a plurality of fins/subfins (or a fin structure) that may be subsequently separated and implemented into the N-type fin region 116 and the P-type fin region 118. During fabrication, the fin structure may be formed of silicon (silicon-based or the like) that is disposed over the respective insulator, cathode, and/or anode regions 102, 104, and 106, extending continuously from one side/edge of the diode device 100 (e.g., the left side of FIG. 1) to the other side/edge of the diode device 100 (e.g., the right side of FIG. 1), according to an embodiment. That is, in one embodiment, the fin structure may have initially (or originally) extended across an entire diode device/unit and continued extending across other adjacent diode devices/units. In one embodiment, the fin structure (i.e., the single continuous fin) may be divided into separate fin structures (or fin portions/segments) to implement (or form) an N-type fin region and a P-type fin region.

Accordingly, in some embodiments, the diode device 100 may have a fin structure (or the like) disposed on/over the insulator, cathode, and/or anode regions 102, 104, and 106, where the fin structure may be divided into two groups of multiple, roughly equal numbered fin structures/segments/portions, one for implementing an implant region of a P-type thereon such as the P-type fin region 118, and the other for implementing an N-type doping region thereon such as the N-type fin region 116. For example, the N-type/P-type fin regions 116 and 118 may be fin portions of the silicon-based fin structure that may have been doped with N-type and P-type dopants (or impurities) to form the respective N-type fin region 116 and the P-type fin region 118, as shown in FIG. 1.

As such, in some embodiments, the P-type fin region 118 may include any P-type (or P+) dopants/impurities known in the art, such as boron, BF2, aluminum, gallium, indium, etc., whereas the N-type fin region 116 may include any N-type (or N+) dopants/impurities known in the art, such as phosphorus, arsenic, antimony, bismuth, etc. In one embodiment, the fin structures, such as the N-type/P-type fin regions 116 and 118, may be fabricated by implementing a photoresist layer and a hard mask layer that are disposed over the insulator, cathode, and anode regions 102, 104, and 106 with suitable processes including deposition, photolithography, and/or etching processes; by patterning and etching a silicon-based layer that is deposited over the insulator, cathode, and anode regions 102, 104, and 106; by using a double-patterning lithography (DPL) process; and/or by a like process.

After the formation of the fin structure/segments, the region(s) (or the portion(s)) of the N-type/P-type fin regions 116 and 118 below the bottom surfaces of the N-type epi portions 126, P-type epi portions 128, and the gate electrodes 114 may be referred to as the subfin region(s) of the diode device 100. Whereas, the portions (or the region(s)) of the N-type/P-type epi portions 126 and 128 above the top surfaces of the N-type/P-type fin regions 116 and 118 (or the subfin region(s) as referred to above) may be referred to as the fin region(s) (or the portion(s)) of the diode device 100.

Each of the gate electrodes 114 may be positioned (or disposed) between two of the N-type/P-type epi portions 126 and 128. As shown in FIG. 1, these elongated gate electrodes 114 are disposed over the subfin region(s) of the diode device 100, such as the N-type/P-type fin regions 116 and 118. The gate electrodes 114 are substantially equal-spaced and parallel to one another, and extended perpendicular to the N-type/P-type fin regions 116 and 118. In the embodiments described herein for a FinFET diode, the gate electrodes 114 may be implemented as inactive regions and used to divide the elongated doped N-type/P-type epi regions 126 and 128. In one embodiment, the gate electrodes 114 may include a gate material such as polysilicon or any other commonly used metals, including Ni, Ti, Ta, Hf, and combinations thereof, metal silicides such as NiSi, MoSi, HfSi, combinations thereof, and metal nitrides such as TiN, TaN, HfN, HfAlN, MoN, NiAlN, and combinations thereof.

The gate electrodes 114 may be formed by any suitable process known in the art, including deposition, photolithography patterning, and etching processes. The deposition of a suitable gate material to form a gate electrode layer may include chemical vapor deposition (CVD), physical vapor deposition (PVD), atomic layer deposition (ALD), molecular beam epitaxy (MBE), high density plasma CVD (HDPCVD), metal organic CVD (MOCVD), remote plasma CVD (RPCVD), plasma enhanced CVD (PECVD), plating, any other suitable processes, and/or combinations thereof. Furthermore, in one embodiment, a gate dielectric layer may be further disposed (or formed) between the gate electrodes 114 and the N-type/P-type fin regions 116 and 118 by any suitable processes. The dielectric material may include commonly used materials such as oxides, nitrides, oxynitrides, and high-k dielectrics such as $Ta_2O_5$, $Al_2O_3$, HfO, $SiTiO_3$, HfSiO, HfSiON, or combinations thereof. In another embodiment, gate spacers may be further disposed (or formed) on one or more sidewalls of the gate dielectric layer and gate structures.

As shown in both illustrations of FIG. 1, the gate electrodes 114 may be disposed between the elongated N-type/P-type epi regions 126 and 128, where two of the N-type/P-type epi regions 126 and 128 are separated by one of the gate electrodes 114. In some embodiments, the N-type/P-type epi portions 126 and 128 may be epitaxially grown on/over the top surfaces of the N-type fin region 116 and the P-type fin region 118, respectively. In one embodiment, the N-type/P-type epi portions 126 and 128 may be formed via a selective epitaxial growth process. The epitaxy process may include CVD with vapor-phase epitaxy (VPE) and/or ultra-high vacuum CVD (UHV-CVD), PVD, MBE, HDPCVD, MOCVD, RPCVD, electro-less deposition, plating, any suitable processes known in the art, and/or combinations thereof. Such an epitaxial process may use either gaseous and/or liquid precursors.

In one embodiment, the N-type/P-type epi portions 126 and 128 may be formed of a semiconductor material(s) which is/are the same as the semiconductor material(s) that is/are used to form the respective N-type/P-type fin regions 116 and 118. In another embodiment, the semiconductor material(s) of the N-type/P-type epi portions 126 and 128 may be different from the semiconductor material(s) used to form the respective N-type/P-type fin regions 116 and 118. For example, the semiconductor material of the epi portions (e.g., the N-type/P-type epi portions 126 and 128) may include silicon Germanium (SiGe) and/or silicon carbon (SiC).

During the epitaxially grown formation, the N-type/P-type epi portions 126 and 128 may be in situ doped by any suitable implantation processes known in the art. That is, in one embodiment, the epi grown portions of the diode device 100 may be doped respectively with N-type impurities, such as phosphorus, arsenic, etc., and with P-type impurities, such as boron, BF2, to form the doped N-type/P-type epi portions 126 and 128. As is known in the art, masks such as photoresist masks may be disposed to cover the regions not to be implanted (or doped).

Additionally, after the implantation process, one or more annealing processes may be performed to activate these doped regions. The annealing processes may include rapid thermal annealing (RTA), laser annealing processes, and/or the like. In some embodiments, after these processes described above, the resulting structure may implement the P/N junction of the diode device 100 that may be formed between either the P-type fin region 118 or the N-type fin region 116, or formed at the interface of the P-type fin region 118 and the N-type fin region 116. Note that, in the embodiment shown in FIG. 1, the doped N-type/P-type epi portions 126 and 128 are formed by an epitaxial growth after the fin structures/segments of the N-type/P-type fin regions(s) have been formed by etching processes or the like. Nonetheless, note that, in an alternate embodiment, the fin structures/segments themselves may be formed by an epitaxial growth on the planar surfaces of the substrate-less region(s), such as the cathode, insulator, and anode regions, rather than being formed by an etching process. In this alternate embodiment, the doped N-type/P-type epi portions may be formed simultaneously with the fin structures as an integral part of them by the epitaxial growth, while being in situ doped.

In some embodiments, the conductive contacts 112 may be disposed on the top surfaces of the N-type/P-type epi portions 126 and 128 as the topside metal contacts of the diode device 100. As shown in the top-view of FIG. 1, the conductive contacts 112 are positioned between two of the gate electrodes 114 and/or the backside vias 110, where the conductive contacts 112 may have a gap (a small opening) between the gate electrodes 114. Additionally, as shown in the top-view of FIG. 1, the conductive contacts 112 may land on the respective N-type/P-type epi portions 126 and 128, however the conductive contacts 112 may have a width that is less than a width of the respective N-type/P-type epi portions 126 and 128, according to an embodiment. Also, in one embodiment, the conductive contacts 112 may extend vertically with the respective N-type/P-type epi portions 126 and 128, where a length of the conductive contacts 112 may protrude (or extend beyond) a length of the respective N-type/P-type epi portions 126 and 128.

These conductive contacts 112 are formed over the doped and active N-type/P-type epi regions 126 and 128 for providing a conduction path for the cathode and anode regions of the diode device 100. Additionally, the routing lines 141-142 may be disposed (or implemented/formed) over the conductive contacts 112 to couple the topside conductive contacts 112 together, where, for example, the routing line 141 may be used to couple the conductive contacts 112 over the N-type fin region 116 to each other, and the routing line 142 may be used to couple the conductive contacts 112 over the P-type fin region 118 to each other.

The conductive contacts 112 may be formed of a conductive material, such as metal or the like. The conductive contacts may be formed by a salicide (self-aligned silicide) process, which involves deposition of a transition metal to form a thin metal layer via a suitable process such as CVD, application of heat to allow the transition metal to react with exposed silicon in the active regions to form a low-resistance transition metal silicide, and removal of any remaining transition metal by chemical etching, leaving silicide contacts only in the active regions. The typical transition metal may include nickel, cobalt, tungsten, tantalum, titanium, platinum, erbium, palladium, and/or combinations thereof.

Lastly, the backside vias 110 may be disposed vertically on the cathode region 104 and the anode region 106. The backside vias 110 may be positioned adjacent to the outer edges of the N-type/P-type fin regions 116 and 118. In one embodiment, the backside vias 110 may have a thickness that is greater than a thickness of the respective N-type/P-type fin regions 116 and 118. Likewise, in such embodiment, the backside vias 110 may have a top surface that is substantially coplanar to a top surface of the conductive contacts 112. In another embodiment, the top surfaces of the backside vias 110 and conductive contacts 112 may be positioned below (in the z-axis) the top surface of the gate electrodes 114.

In some embodiments, the backside vias 110 may be formed of a conductive material, such as Al, Cu, tungsten, metal alloys (e.g., an alloy of Al and Cu), and/or any other suitable electrical contact forming conductive material, to provide an electrical contact for the cathode and/or anode regions 104 and 106. In addition, each of the backside vias 110 may act as a conductive interconnect used to couple a first conductor, such as the cathode region 104 and/or the anode region 106, to a second conductor, such as the conductive contacts 112, where the first and second conductors may be disposed on different interconnect levels, according to an embodiment. Lastly, in these embodiments, the diode device 100 may additionally dispose (or implement/form) the topside routing lines 141-142 as conductive/metal wires (or the like) to couple the topside conductive contacts 112 on/over the respective topside N-type/P-type epi portions 126 and 128 to the respective backside metals of the cathode and anode regions 104 and 106.

Note that the diode device 100 may include fewer, additional or alternative packaging components based on the desired packaging design.

Referring now to FIG. 2, a cross-sectional illustration of a diode device 200 is shown, in accordance with an embodiment. In one embodiment, the diode device 200 may be a substrate-less FinFET lateral diode with parallel backside vias. The diode device 200 may be substantially similar to the diode device 100 described above in FIG. 1, with the exception that the parallel backside vias 210 are disposed (or positioned) horizontally parallel to the N-type/P-type fin regions 216 and 218. Whereas the backside vias 110 are disposed adjacently and coupled to the outer edges of the respective N-type/P-type fin regions 116 and 118 in FIG. 1, the parallel backside vias 210 are entirely separated from the respective N-type/P-type fin regions 216 and 218 in FIG. 2. That is, as shown in both views of FIG. 2, the parallel backside vias 210 run horizontally parallel to the respective N-type/P-type fin regions 216 and 218.

As described above, the N-type/P-type fin regions 216 and 218, the N-type/P-type epi portions 226 and 228, the parallel backside vias 210, the gate electrodes 214, and the insulator, cathode, and anode regions 202, 204, and 206 of the diode device 200 may be substantially similar to the N-type/P-type fin regions 116 and 118, the N-type/P-type epi portions 126 and 128, the backside vias 110, the gate electrodes 114, and the insulator, cathode, and anode regions 102, 104, and 106 of the diode device 100 in FIG. 1. In one embodiment, as shown in the top-view of FIG. 2, the parallel backside vias 210 may be disposed horizontally parallel to the respective N-type/P-type fin regions 226 and 228, where a gap (or an opening) over the insulator region 210 may separate the backside via 210 coupled to the N-type fin region 216 from the backside via 210 coupled to the P-type fin region 218. In an alternate embodiment, the parallel backside vias 210 may occupy a space between a group of fin regions.

In some embodiments, the backside vias 210 may have a thickness that is substantially equal to a thickness of the respective N-type/P-type fin regions 216 and 218. Likewise, in such embodiment, the backside vias 210 may have a top surface that is substantially coplanar to a top surface of the respective N-type/P-type fin regions 216 and 218. Furthermore, the conductive contacts 212 may be disposed on both of the top surfaces of the parallel backside vias 210 and the respective N-type/P-type fin regions 216 and 218. As such, the conductive contacts 212 (or most of the conductive contacts 212) may have a length that extends (and protrudes) over/beyond both the lengths of the parallel backside vias 210 and the respective N-type/P-type fin regions 216 and 218. Note that one of the conductive contacts 212 may be disposed over only the N-type fin region 216 that is positioned over the insulator region 202—and not with one of the parallel backside vias 210.

For one embodiment, the parallel backside vias 210 are entirely separated from the respective N-type/P-type fin regions 216 and 218 by an insulator material 203. The insulator material 203 may surround each of the parallel backside vias 210, where the insulator material 203 may be disposed adjacent to the outer, long-sided edges of each parallel backside via 210 (as shown in the top-view of FIG. 2). In one embodiment, the insulator material 203 has a thickness that is less than a thickness of the parallel backside vias 210 and the N-type/P-type fin regions 216 and 218. In some embodiments, the insulator material 203 may be the same material used for the formation of the insulator region 202. In an alternate embodiment, the insulator material 203 may be a different material than the material used for the formation of the insulator region 202. In one embodiment, the insulator material 203 may include glass, silicon dioxide, a dielectric, or the like. The dielectric may be any known dielectric material, such as low-k dielectric materials. Examples of dielectric materials that may be used include, but are not limited to, silicon oxide, CDO, silicon nitride, organic polymers such as perfluorocyclobutane and/or polytetrafluoroethylene, FSG, and/or organosilicates, such as silsesquioxane, siloxane, and/or organosilicate glass.

Note that the diode device 200 may include fewer, additional or alternative packaging components based on the desired packaging design.

Figure 3:
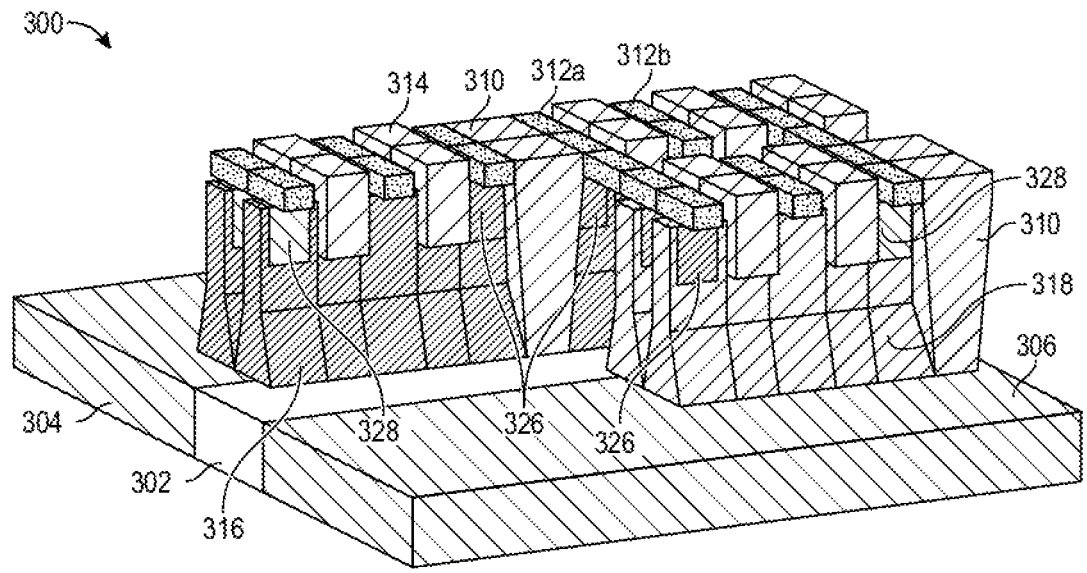
FIG. 3 is an illustration of a cross-sectional view and a respective plan view of a dual-polarity lateral diode with an N-type fin region, a P-type fin region, and a plurality of backside vias, according to one embodiment.
Figure 3:
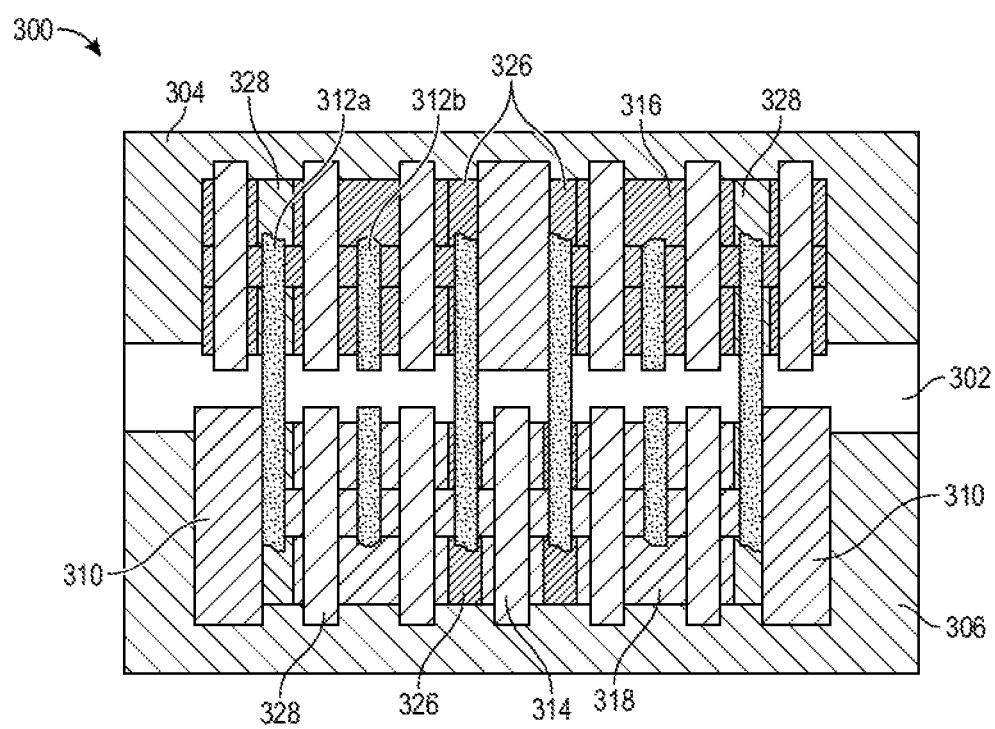
Figure 4:
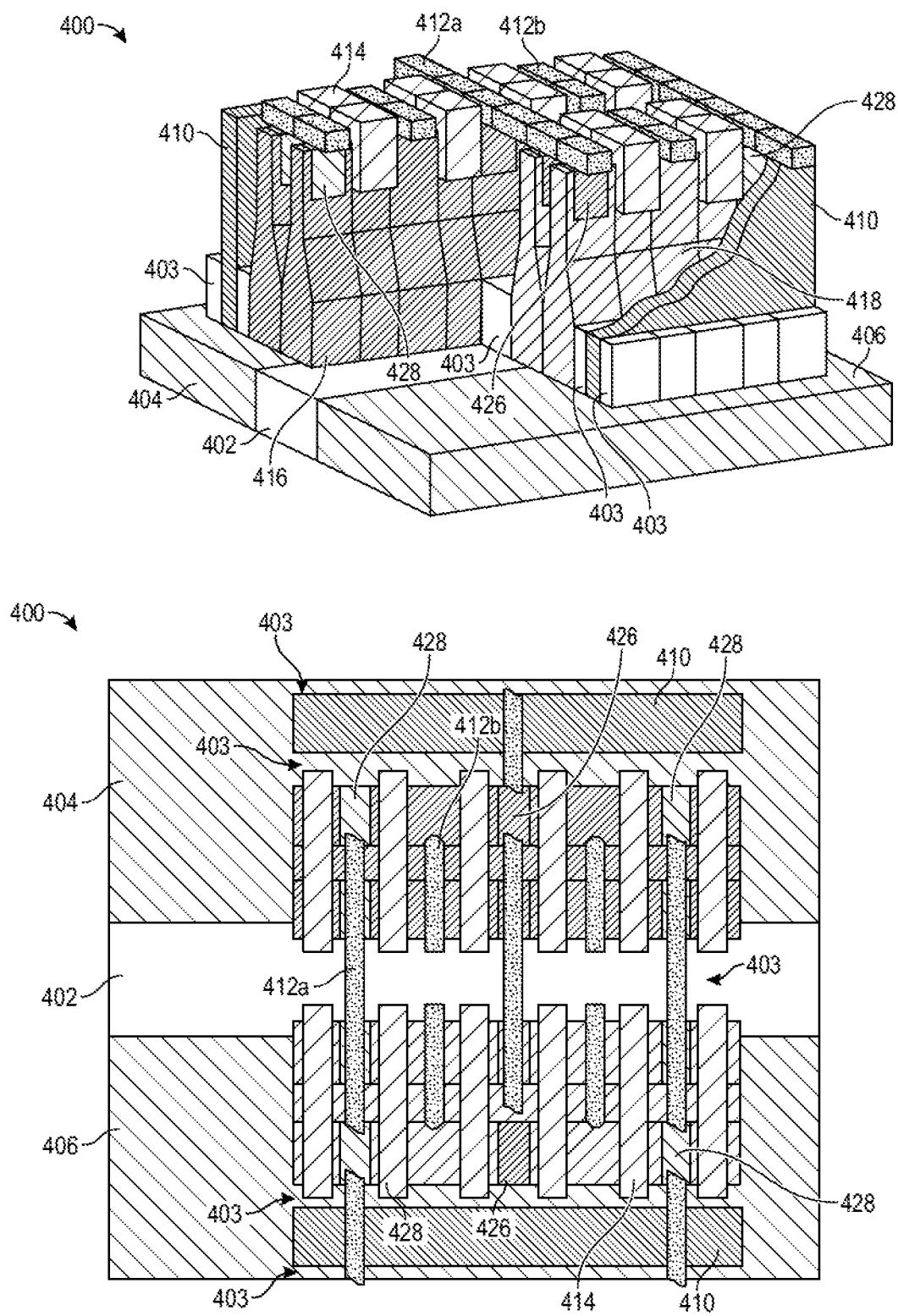
FIG. 4 is an illustration of a cross-sectional view and a respective plan view of a dual-polarity lateral diode with an N-type fin region, a P-type fin region, and a plurality of parallel backside vias, where the plurality of parallel backside vias are positioned in parallel to the respective N-type and P-type fin regions, according to one embodiment.

FIGS. 3-4 illustrate approaches to implement dual-polarity lateral diode devices with backside vias and/or parallel backside vias. These dual-polarity lateral diodes may use separate N-type and P-type fin regions with opposite polarity epi portions to form the diode junctions. Since each fin region has only one polarity, the backside metal of each cathode and anode region may run the length of the fin region to provide superior thermal heat-sinking. However, in order to provide backside connections for both terminals of such diode, both N-type and P-type fin regions may be used in tandem to implement the dual-polarity lateral diode. The N-type fin region and the respective backside via may provide the backside contacts for all of the fins on the cathode region, as well as the N-epi regions, while the P-type fin region and the respective backside vias may provide the backside contacts for all of the fins on the anode region as well as the P-epi regions. Similar to the lateral diodes of FIGS. 1-2, these embodiments described below may also use both fin-cut backside vias and parallel backside vias to implement the dual-polarity lateral diodes of FIGS. 3-4. Note that, in some views, portions of the fins, insulators, metals, and vias may have been removed in such devices for clarity.

Referring now to FIG. 3, a cross-sectional and respective top-view illustration of a diode device 300 is shown, in accordance with an embodiment. In one embodiment, the diode device 300 may be a substrate-less FinFET dual-polarity lateral diode with backside vias. The diode device 300 may be substantially similar to the diode device 100 described above in FIG. 1, with the exception that the insulator, cathode, and anode regions 302, 304, and 306 extend laterally (in a lateral direction) to cover the widths of the respective N-type/P-type fin regions 316 and 318, and that the N-type/P-type fin region 316 and 318 are implemented separately using opposite polarity N-type/P-type epi portions 326 and 328 to form the respective diode junctions. As described above, the N-type/P-type fin regions 316 and 318, the N-type/P-type epi portions 326 and 328, the backside vias 310, the conductive contacts 312a-b, the gate electrodes 314, and the insulator, cathode, and anode regions 302, 304, and 306 of the diode device 300 may be substantially similar to the N-type/P-type fin regions 116 and 118, the N-type/P-type epi portions 126 and 128, the backside vias 110, the conductive contacts 112, the gate electrodes 114, and the insulator, cathode, and anode regions 102, 104, and 106 of the diode device 100 in FIG. 1.

In some embodiments, the diode device 300 may include the N-type fin region 316 disposed over portions of the cathode region 304 and the insulator region 302, while the P-type fin region 318 is disposed over portions of the anode region 306 and the insulator region 302. For one embodiment, a plurality of N-type epi grown portions 326, a plurality of gate electrodes 314, and a plurality of P-type epi grown portions 328 may be disposed over the respective N-type fin region 316 and the P-type fin region 318, where each of the gate electrodes 314 is positioned between two (or adjacent to at least one) of the N-type/P-type epi portions 326 and 328. In some embodiments, a plurality of conductive contacts 312a-b (or the topside metal contacts) are disposed over the N-type/P-type epi portions 326 and 328 and/or the N-type/P-type fin regions 316 and 318 to form the topside metal contacts of the diode device 300, where the conductive contacts 312a have a length that is greater than a length of the conductive contacts 312b. In one embodiment, the conductive contacts 312a are coupled to and extend over both the N-type/P-type fin regions 316 and 318, while the conductive contacts 312b are coupled to and extend over only one of the N-type/P-type fin regions 316 and 318. The conductive contacts 312a-b may be positioned between the gate electrodes 314 and/or between one gate electrode 314 and one of the backside vias 310.

In some embodiments, the backside vias 310 may be disposed vertically on the cathode region 304 and/or the anode region 306, where two or more of the backside vias 310 may be positioned adjacent to the outer edges of the P-type fin region 318, and one or more of the backside vias 310 may be positioned within the N-type fin region 316 (i.e., the backside via 310 may be surrounded (or embedded) by one portion of the N-type fin region 316 on one side (the left-side as shown in FIG. 3) and another portion of the N-type fin region 318 on the other/opposite side (the right-side as shown in FIG. 3)). In one embodiment, the N-type fin region 316 has the conductive contacts 312a and one backside via 310 to couple the N-type epi portions 326 of the cathode and anode regions 304 and 306. For another embodiment, the P-type fin region 318 has the conductive contacts 312a and two backside vias 310 disposed on opposite ends of the P-type fin region 318, where these two backside vias 310 are used to couple the P-type epi portions 328 of the cathode and anode regions 304 and 306. Note that these embodiments of the diode device 300 may describe only a portion of a full array of diode devices, where the backside vias 310 are not limited to this exact configuration.

As shown in FIG. 3, the cathode region 304 may have a length that is greater than a length of the N-type fin region 316 and/or the P-type fin region 318. Similarly, the anode region 306 may have a length that is greater than a length of the N-type fin region 316 and/or the P-type fin region 318. In one embodiment, the length of the cathode region 304 may be approximately equal to the length of the anode region 306. Likewise, in another embodiment, the insulator region 302 has a length that is approximately equal to both lengths of the cathode and anode regions 304 and 306. Additionally, as described above, unlike the N-type/P-type fin regions of FIGS. 1-2, each of the N-type/P-type fin regions 316 and 318 may implement (or epitaxially grow) both N-type/P-type epi portions 326 and 328, thereby creating the diode P/N junctions for the N-type fin region 316 and the P-type fin region 318.

Note that the diode device 300 may include fewer, additional or alternative packaging components based on the desired packaging design.

Referring now to FIG. 4, a cross-sectional and respective top-view illustration of a diode device 400 is shown, in accordance with an embodiment. In one embodiment, the diode device 400 may be a substrate-less FinFET dual-polarity lateral diode with parallel backside vias. The diode device 400 may be substantially similar to the diode device 300 described above in FIG. 3, with the exception that the parallel backside vias 410 are disposed (or positioned) horizontally parallel to the N-type/P-type fin regions 416 and 418. Whereas the backside vias 310 are disposed in the N-type fin region 316 and adjacent to the outer edges of the P-type fin region 318 in FIG. 3, the parallel backside vias 410 are entirely separated from the respective N-type/P-type fin regions 416 and 418 in FIG. 4. That is, as shown in both views of FIG. 4, the parallel backside vias 410 run horizontally parallel to the respective N-type/P-type fin regions 416 and 418.

As described above, the N-type/P-type fin regions 416 and 418, the N-type/P-type epi portions 426 and 428, the parallel backside vias 410, the conductive contacts 412a-b, the gate electrodes 414, and the insulator, cathode, and anode regions 402, 404, and 406 of the diode device 400 may be substantially similar to the N-type/P-type fin regions 316 and 318, the N-type/P-type epi portions 326 and 328, the backside vias 310, the conductive contacts 312a-b, the gate electrodes 314, and the insulator, cathode, and anode regions 302, 304, and 306 of the diode device 300 in FIG. 3.

In one embodiment, as shown in the top-view of FIG. 4, the parallel backside vias 410 may be disposed horizontally parallel to the respective N-type/P-type fin regions 416 and 418, where gaps (or openings) over the cathode and anode regions 404 and 406 may separate the respective parallel backside vias 410 from the N-type/P-type fin regions 416 and 418. That is, one backside via 410 may be disposed entirely over the cathode region 404 and adjacent to the N-type fin region 416, while another backside via 410 may be disposed entirely over the anode region 406 and adjacent to the P-type fin region 418. Additionally, in some embodiments, the parallel backside via 410 over the cathode region 404 may be coupled to the N-type epi portions 426 of the N-type/P-type fin regions 416 and 418 with the conductive contacts 412a. Similarly, in another embodiment, the parallel backside via 410 over the anode region 406 may be coupled to the P-type epi portions 428 of the N-type/P-type fin regions 416 and 418 with the conductive contacts 412a.

In some embodiments, the parallel backside vias 410 may have a width that is substantially equal to a width of the respective N-type/P-type fin regions 416 and 418. In another embodiment, the parallel backside vias 410 may have a width that is different than a width of the respective N-type/P-type fin regions 416 and 418. Accordingly, the parallel backside via 410 over the cathode region 404 may have a width that is substantially equal to a width of the parallel backside via 410 over the anode region 406. In an alternate embodiment, the parallel backside via 410 over the cathode region 404 may have a width that is different than a width of the parallel backside via 410 over the anode region 406.

In some embodiments, the parallel backside vias 410 may have a thickness that is substantially equal to a thickness of the respective N-type/P-type fin regions 416 and 418. Likewise, in such embodiment, the parallel backside vias 410 may have a top surface that is substantially coplanar to a top surface of the respective N-type/P-type fin regions 416 and 418. Furthermore, the conductive contacts 412a may be disposed on both of the top surfaces of the parallel backside vias 410 and the respective N-type/P-type fin regions 416 and 418. Additionally, the conductive contacts 412a may have a length that extends (and protrudes) over/beyond both the lengths of the N-type/P-type fin regions 416 and 418 and the respective parallel backside vias 410.

For one embodiment, the parallel backside vias 410 may be entirely separated from the respective N-type/P-type fin regions 426 and 428 by an insulator material 403. The insulator material 403 may be substantially similar to the insulator material 203 described above in FIG. 2. The insulator material 403 may surround each of the parallel backside vias 410, where the insulator material 403 may be disposed adjacent to the outer, long-sided edges of each parallel backside via 410 (as shown in the top-view of FIG. 4). Furthermore, in one embodiment, the insulator material 403 may be disposed over the insulator region 402 to separate the N-type fin region 416 on the cathode region 404 from the P-type fin region 418 on the anode region 406. In one embodiment, the insulator material 403 has a thickness that is less than a thickness of the parallel backside vias 410 and the N-type/P-type fin regions 416 and 418.

Note that the diode device 400 may include fewer, additional or alternative packaging components based on the desired packaging design.

Figure 5:
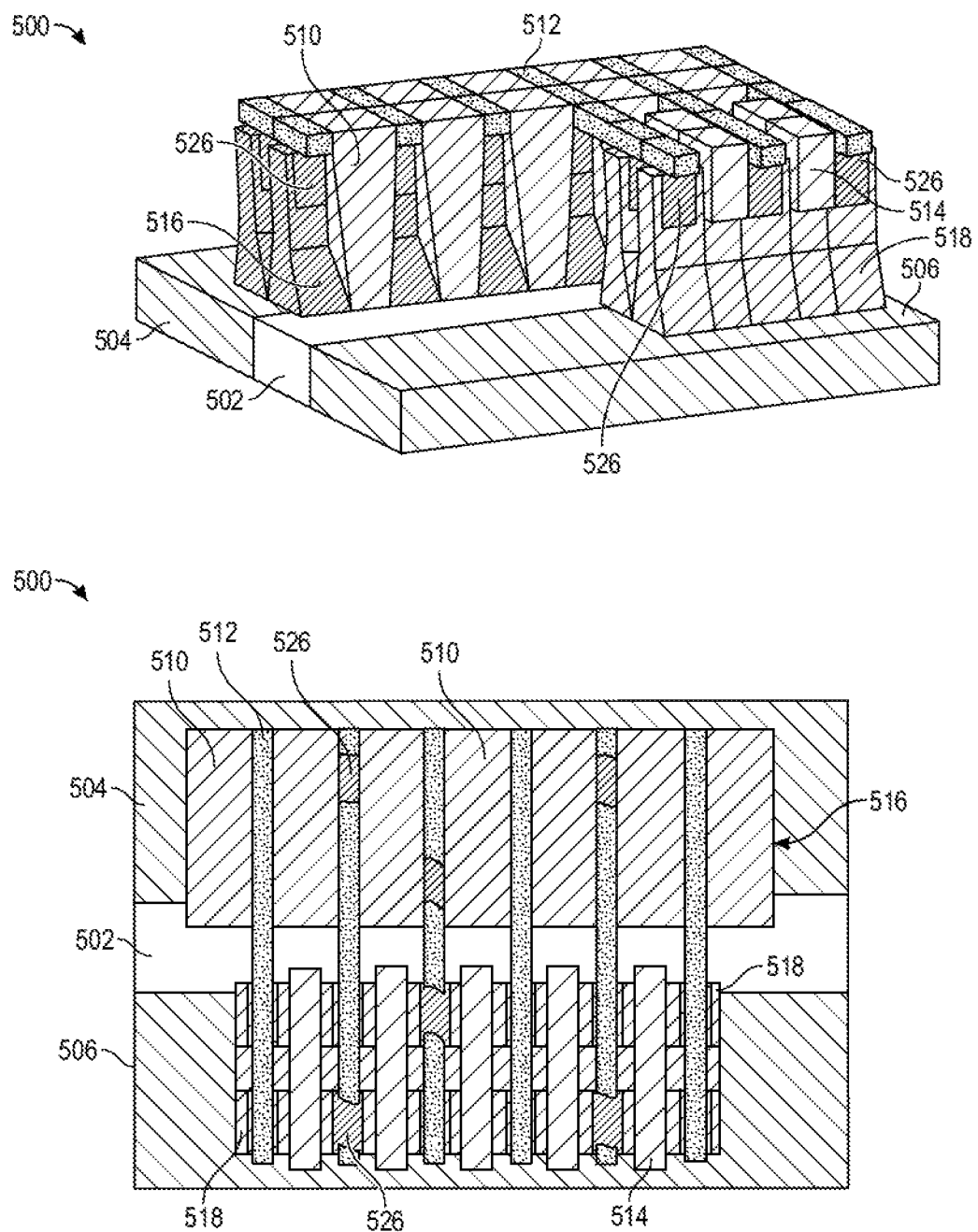
FIG. 5 is an illustration of a cross-sectional view and a respective plan view of a vertical diode with an N-type fin region, a P-type fin region, and a plurality of backside vias, according to one embodiment.
Figure 6:
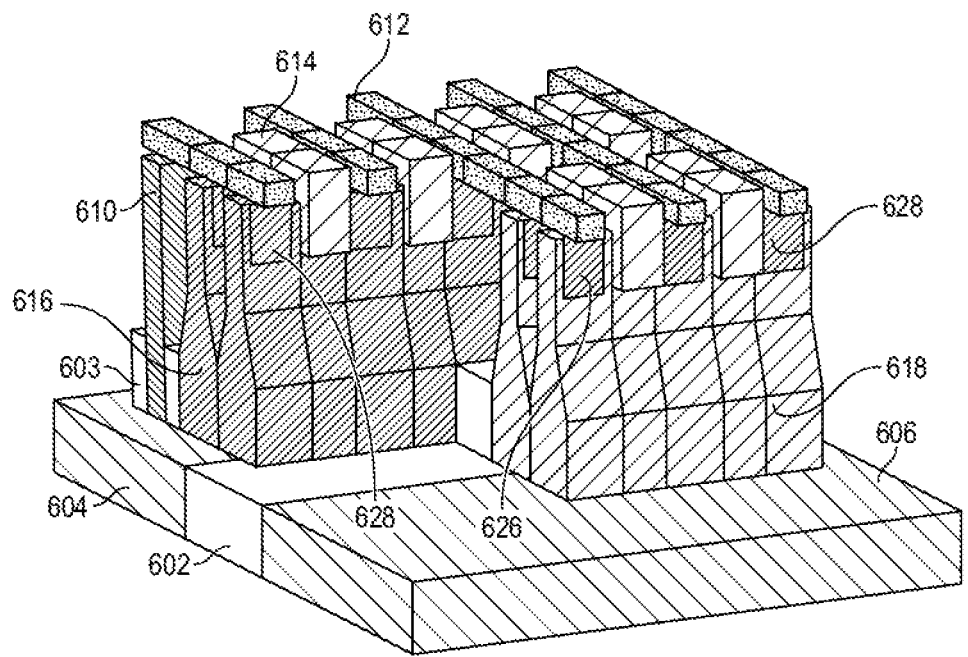
FIG. 6 is an illustration of a cross-sectional view and a respective plan view of a vertical diode with an N-type fin region, a P-type fin region, and a parallel backside via, where the parallel backside via is positioned in parallel to the N-type fin region, according to one embodiment.
Figure 6:
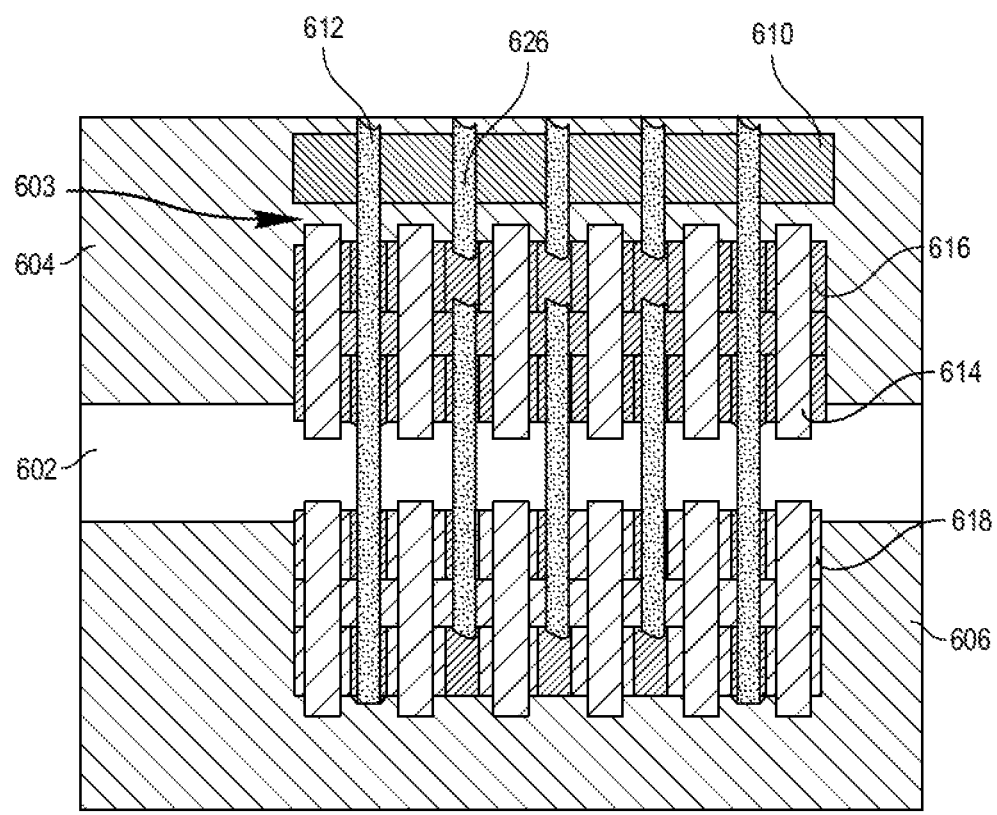

FIGS. 5 and 6 illustrate approaches to implement vertical diode devices with backside vias and/or parallel backside vias. These vertical diodes implement N-type/P-type fin regions with opposite polarity epi portions to form the respective diode junctions. Unlike the lateral diodes in FIGS. 1-4, these vertical diodes described below may be implemented without a channel region and the sub-threshold leakage typically associated with the channel region. For example, the vertical diode may rely on the Ohmic connection between the backside metal of the anode region and the P-type fin region to provide contacts for one terminal of the vertical diode. Accordingly, since the other diode terminal may not be routed to the same backside metal track without causing a short, an adjacent group of fins, such as the N-type fin region, may be used as an array of backside vias to provide the missing connection/terminal of the vertical diode. Similar to the diode devices of FIGS. 1-4, these embodiments described below may also use both fin-cut backside vias and parallel backside vias to implement the vertical diodes of FIGS. 5-6. Note that, in some views, portions of the fins, insulators, metals, and vias may have been removed in such devices for clarity.

Referring now to FIG. 5, a cross-sectional and respective top-view illustration of a diode device 500 is shown, in accordance with an embodiment. In one embodiment, the diode device 500 may be a substrate-less FinFET vertical diode with backside vias. The diode device 500 may be substantially similar to the diode device 300 described above in FIG. 3, with the exception that the backside vias 510 are implemented only with the N-type fin region 516 that is disposed over the cathode and insulator regions 504 and 502, and that both the N-type/P-type fin regions 516 and 518 only include the N-type epi portions 526. As described above, the N-type/P-type fin regions 516 and 518, the N-type epi portions 526, the backside vias 510, the conductive contacts 512, the gate electrodes 514, and the insulator, cathode, and anode regions 502, 504, and 506 of the diode device 500 may be substantially similar to the N-type/P-type fin regions 316 and 318, the N-type epi portions 326, the backside vias 310, the conductive contacts 312, the gate electrodes 314, and the insulator, cathode, and anode regions 302, 304, and 306 of the diode device 300 in FIG. 3.

In some embodiments, the diode device 500 may include the N-type fin region 516 disposed over portions of the cathode region 504 and the insulator region 502, while the P-type fin region 518 is disposed over portions of the anode region 506 and the insulator region 502. Note that these diode devices 500 may be implemented with P-type epis in N-type fins or with N-type epis in P-type fins. For one embodiment, the N-type epi portions 526 may be disposed over both the N-type/P-type fin regions 516 and 518, whereas the N-type epi portions 526 and the gate electrodes 514 may be disposed over only the P-type fin region 516. Note that in these diode devices 500 the epi types and fin types formed around the backside vias 510 is not limited to any specific configuration, but the epi type has to be opposite to the fin type disposed over the respective diode portion(s).

In this embodiment, each of the gate electrodes 514 may be positioned between two of the N-type epi portions 526 that are epitaxially grown on the P-type fin region 516. Also, note that the diode device 500 may be implemented by growing the P-epi portion over the N-type fin region on the cathode region while moving the backside vias to the anode region. In some embodiments, a plurality of conductive contacts 512 (or the topside metal contacts) are disposed over the N-type epi portions 526 of the N-type/P-type fin regions 516 and 518 to form the topside metal contacts of the diode device 500. In one embodiment, the conductive contacts 512 are coupled to and extend over both the N-type/P-type fin regions 516 and 518 that are disposed over the cathode and anode regions 504 and 506, respectively. The conductive contacts 512 may be positioned between the gate electrodes 514 and/or between one gate electrode 514 and one of the backside vias 510 of the N-type fin region 516.

In some embodiments, the backside vias 510 may be disposed vertically on the cathode region 504 and positioned only within the N-type fin region 516 (i.e., the backside vias 510 may be surrounded (or embedded) by portions of the N-type fin region 516). For example, in some embodiments as shown in the top-view of FIG. 5, the top surfaces of the N-type fin region 516 and the N-type epi portions 526 may be substantially covered by the backside vias 510 and the conductive contacts 512. As such, in one embodiment, the N-type fin region 516 has the conductive contacts 512 (and/or the backside vias 510) to couple the N-type epi portions 526 of the cathode and anode regions 504 and 506.

Note that the diode device 500 may include fewer, additional or alternative packaging components based on the desired packaging design.

Referring now to FIG. 6, a cross-sectional and respective top-view illustration of a diode device 600 is shown, in accordance with an embodiment. In one embodiment, the diode device 600 may be a substrate-less FinFET vertical diode with parallel backside vias. The diode device 600 may be substantially similar to the diode device 500 described above in FIG. 5, with the exception that the parallel backside via 610 is disposed (or positioned) horizontally parallel to the N-type fin region 616 and over only the cathode region 604, and that the gate electrodes 614 are disposed over both the N-type/P-type fin regions 616 and 618. Whereas the backside via 510 is disposed only with the N-type fin region 516 and over both the cathode and insulator regions 504 and 502 in FIG. 5, the parallel backside via 610 is entirely separated from the N-type fin region 616 and disposed only over the cathode region 604 in FIG. 6. That is, as shown in both views of FIG. 4, the parallel backside vias 410 run horizontally parallel to the respective N-type/P-type fin regions 416 and 418.

As described above, the N-type/P-type fin regions 616 and 618, the N-type epi portions 626, the parallel backside via 610, the conductive contacts 612, the gate electrodes 614, and the insulator, cathode, and anode regions 602, 604, and 606 of the diode device 600 may be substantially similar to the N-type/P-type fin regions 516 and 518, the N-type epi portions 526, the backside vias 510, the conductive contacts 512, the gate electrodes 514, and the insulator, cathode, and anode regions 502, 504, and 506 of the diode device 500 in FIG. 5.

In one embodiment, as shown in the top-view of FIG. 6, the parallel backside via 610 may be disposed horizontally parallel and adjacent to the N-type fin regions 616 (e.g., note that this portion/area could be made of the N-type fins or P-type fins), where a gap (or opening) over the cathode region 604 may separate the parallel backside via 610 from the N-type fin region 616. That is, the parallel backside via 610 may be disposed entirely over the cathode region 604 and adjacent to the N-type fin region 616. Additionally, in some embodiments, the parallel backside via 610 over the cathode region 604 may be coupled to the N-type epi portions 626 of the N-type/P-type fin regions 616 and 618 with the conductive contacts 612.

In some embodiments, the parallel backside via 610 may have a width that is substantially equal to a width of the respective N-type/P-type fin regions 616 and 618. In another embodiment, the parallel backside via 610 may have a width that is different than a width of the N-type fine region 616 and/or the P-type fin regions 618. In some embodiments, the parallel backside via 610 may have a thickness that is substantially equal to a thickness of the N-type/P-type fin regions 616 and 618. Likewise, in such embodiment, the parallel backside via 610 may have a top surface that is substantially coplanar to a top surface of the N-type/P-type fin regions 616 and 618. Furthermore, the conductive contacts 612 may be disposed on the top surfaces of the parallel backside via 610 and the N-type/P-type fin regions 616 and 618. Additionally, the conductive contacts 612 may have a length that extends (and protrudes) over/beyond both the lengths of the N-type/P-type fin regions 616 and 618 and the parallel backside via 610.

For one embodiment, the parallel backside via 610 may be entirely separated from the N-type fin region 616 by an insulator material 603. The insulator material 603 may be substantially similar to the insulator material 203 described above in FIG. 2. The insulator material 603 may surround each of the parallel backside vias 610, where the insulator material 603 may be disposed adjacent to the outer, long-sided edges of each parallel backside via 610 (as shown in the top-view of FIG. 6). Furthermore, in one embodiment, the insulator material 603 may be disposed over the insulator region 602 to separate the N-type fin region 616 on the cathode region 604 from the P-type fin region 618 on the anode region 606. In one embodiment, the insulator material 603 has a thickness that is less than a thickness of the parallel backside via 610 and the N-type/P-type fin regions 616 and 618.

Note that the diode device 600 may include fewer, additional or alternative packaging components based on the desired packaging design.

Figure 7:
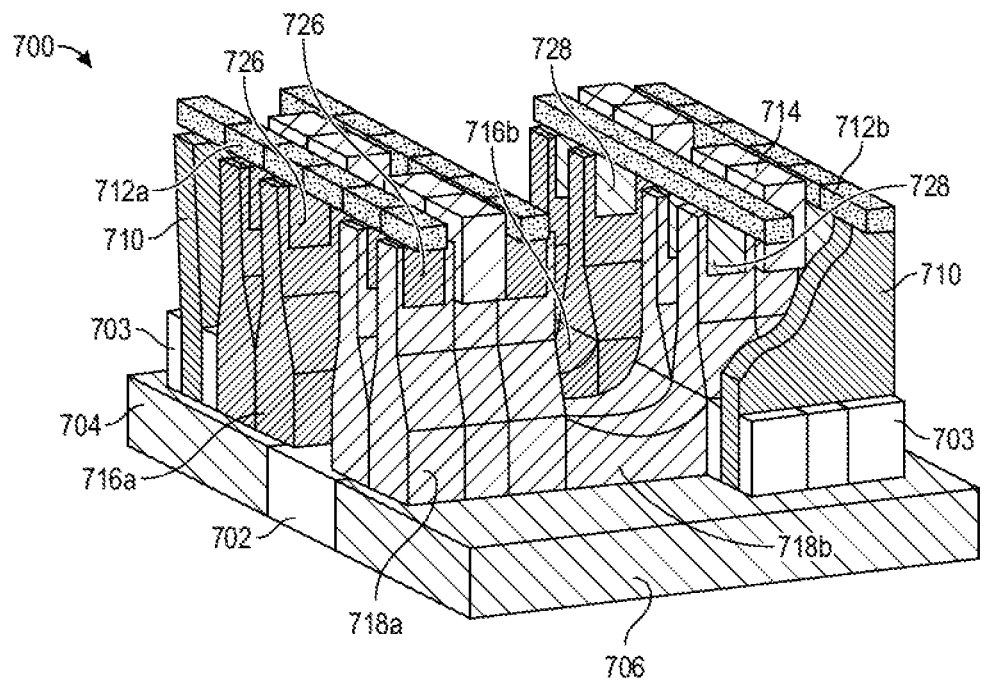
FIG. 7 is an illustration of a cross-sectional view and a respective plan view of a shallow isolation diode with an N-type fin region, a P-type fin region, and a plurality of parallel backside vias, where the plurality of parallel backside vias are positioned in parallel to the respective N-type and P-type fin regions, according to one embodiment.
Figure 7:
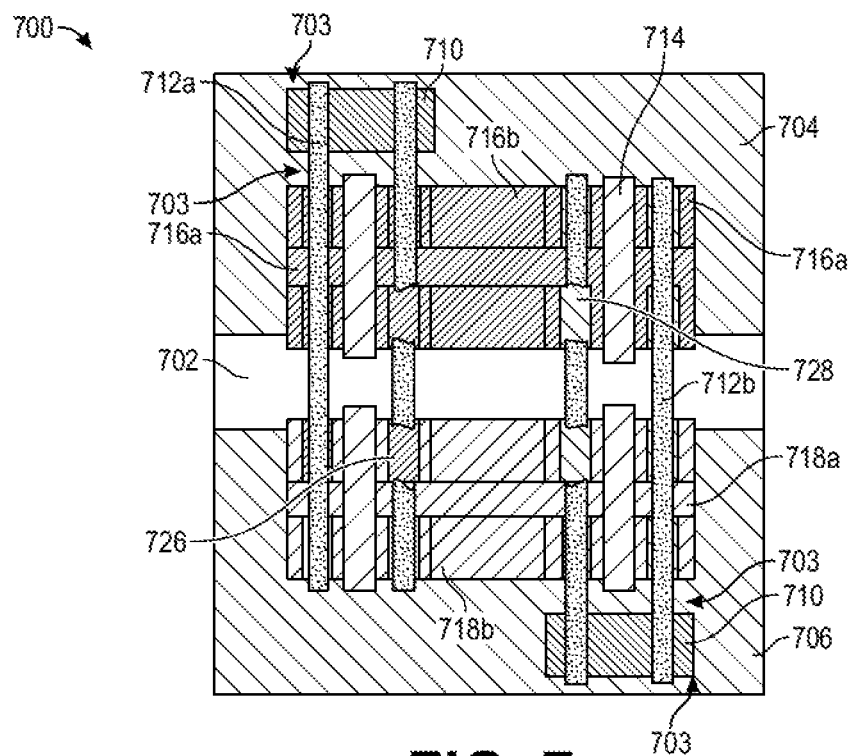

FIG. 7 illustrates one of the approaches to implement dual-polarity shallow trench isolation (STI) diode devices with parallel backside vias. These dual-polarity STI diodes may be similar to the dual-polarity lateral diodes in FIGS. 3-4. Also, some of the design components (or features) of the dual-polarity STI diodes may be implemented with (or added to) the lateral diodes in FIGS. 1-2. The embodiments described below enable the diode device to use STI regions between the opposite epi portions of the respective fin/subfin regions, while providing a substantial reduction in reverse-bias leakage by removing the channel regions. Similar to the diode devices of FIGS. 1-6, the embodiments described below may also use both fin-cut backside vias and/or parallel backside vias to implement the dual-polarity STI diode of FIG. 7. Note that, in some views, portions of the fins, insulators, metals and vias may have been removed in such device for clarity.

Referring now to FIG. 7, a cross-sectional and respective top-view illustration of a diode device 700 is shown, in accordance with an embodiment. In one embodiment, the diode device 700 may be a substrate-less FinFET dual-polarity STI diode with parallel backside vias. The diode device 700 may be substantially similar to the diode devices 300 and 400 described above in FIGS. 3-4, with the exception that the N-type/P-type fin regions 716a and 718a have respective N-type/P-type STI regions 716b and 718b, and that the N-type epi portions 726 are disposed on one side of the N-type/P-type fin regions 716a and 718a (e.g. on the left-side of the diode device 700 of FIG. 7), and the P-type epi portions 728 are disposed on the other/opposite side of the N-type/P-type fin regions 716a and 718a (e.g. on the right-side of the diode device 700 of FIG. 7). That is, the N-type fin region 716a may have the N-type epi portions 726 located on the left-side of the N-type STI region 716b, while the N-type fin region 716a may have the P-type epi portions 728 located on the right-side of the N-type STI region 716b. Similarly, that is, the P-type fin region 718a may have the N-type epi portions 726 located on the left-side of the P-type STI region 718b, while the P-type fin region 718a may have the P-type epi portions 728 located on the right-side of the P-type STI region 718b.

As described above, the N-type/P-type fin regions 716a and 718a, the N-type/P-type epi portions 726 and 728, the parallel backside vias 710, the conductive contacts 712a-b, the gate electrodes 714, the insulator material 703, and the insulator, cathode, and anode regions 702, 704, and 706 of the diode device 700 may be substantially similar to the N-type/P-type fin regions 416 and 418, the N-type/P-type epi portions 426 and 428, the parallel backside vias 410, the conductive contacts 412a-b, the gate electrodes 414, the insulator material 403, and the insulator, cathode, and anode regions 402, 404, and 406 of the diode device 400 in FIG. 4.

In some embodiments, the diode device 700 may include the N-type fin region 716a disposed over portions of the cathode region 704 and the insulator region 702, while the P-type fin region 718a is disposed over portions of the anode region 706 and the insulator region 702. For one embodiment, the N-type epi portions 726, the gate electrodes 714, and the P-type epi portions 728 may be disposed over the respective N-type/P-type fin regions 716a and 718a, where the gate electrodes 714 are positioned either between two N-type epi portions 726 or two P-type epi portions 728 that are disposed over the N-type/P-type fin regions 716a and 718a. In some embodiments, the conductive contacts 712a are disposed over the N-type epi portions 726 of the N-type/P-type fin regions 716a and 718b, while the conductive contacts 712b are disposed over the P-type epi portions 728 of the N-type/P-type fin regions 716a and 718a. In one embodiment, the conductive contacts 712a may have a length that is approximately equal to a length of the conductive contacts 712b. In one embodiment, the conductive contacts 712a are coupled to and extend over both the N-type/P-type fin regions 716a and 718a and the parallel backside vias 710 over the cathode region 704, while the conductive contacts 712b are coupled to and extend over both the N-type/P-type fin regions 716a and 718a and the parallel backside vias 710 over the anode region 706. The conductive contacts 712a-b may be positioned adjacent to the gate electrodes 714.

In one embodiment, the parallel backside vias 710 of/on the cathode region 704 has the conductive contacts 712a to couple the N-type epi portions 726 of the N-type/P-type fin regions 716a and 718b. For another embodiment, the parallel backside vias 710 of/on the anode region 706 has the conductive contacts 712b to couple the P-type epi portions 728 of the N-type/P-type fin regions 716a and 718a. Additionally, as described above, unlike the N-type/P-type fin regions of FIGS. 3-4, the N-type/P-type fin regions 716a and 718a may respectively implement the N-type/P-type STI regions 716b and 718b, where such N-type/P-type STI regions 716b and 718b may be shallow fin-cuts that are patterned into the respective N-type/P-type fin regions 716a and 718a. In these embodiments, the N-type STI region 716b may be similarly patterned as the P-type STI region 718b, where the N-type STI region 716b may include the same material as the N-type fin region 716a, and the P-type STI region 718b may include the same material as the P-type fin region 718a. In some embodiments, the N-type/P-type STI regions 716b and 718b may have a thickness that is considerably less than a thickness of the N-type/P-type fin regions 716a and 718a. In one embodiment, the thickness of the N-type STI region 716b may be approximately equal to the thickness of the P-type STI region 718b.

Additionally, the parallel backside vias 710 may be substantially similar to the parallel backside vias 410 described above in FIG. 4, with the exception that the parallel backside vias 710 over the cathode region 704 may extend to cover only the length of the left-side of the N-type/P-type fin regions 716a and 718a (i.e., this parallel backside vias 710 may approximately extend only from the left edges of the N-type/P-type fin regions 716a and 718a to the left edges (or the nearest edges) of the N-type/P-type STI regions 716b and 718b), and that the parallel backside vias 710 over the anode region 706 may extend to cover only the length of the right-side of the N-type/P-type fin regions 716a and 718a (i.e., this parallel backside vias 710 may approximately extend only from the right edges of the N-type/P-type fin regions 716a and 718a to the right edges (or the nearest edges) of the N-type/P-type STI regions 716b and 718b). As such, as shown in FIG. 7, the parallel backside vias 710 over the cathode region 704 is disposed (or positioned) horizontally parallel and adjacent to the N-type fin region 716a, while the parallel backside vias 710 over the anode region 706 is disposed horizontally parallel and adjacent to the P-type fin region 718a.

In one embodiment, as shown in the top-view of FIG. 7, the parallel backside vias 710 may be disposed horizontally parallel to the respective N-type/P-type fin regions 716a and 718a, where gaps (or openings) over the cathode and anode regions 704 and 706 may separate the respective parallel backside vias 710 from the N-type/P-type fin regions 716a and 718a. That is, one backside vias 710 may be disposed entirely over the cathode region 704 and adjacent to the N-type fin region 716a, while the other backside vias 710 may be disposed entirely over the anode region 706 and adjacent to the P-type fin region 718a. Additionally, in some embodiments, the parallel backside vias 710 over the cathode region 704 may be coupled to the N-type epi portions 726 of the N-type/P-type fin regions 716a and 718a with the conductive contacts 712a, while the parallel backside vias 710 over the anode region 706 may be coupled to the P-type epi portions 728 of the N-type/P-type fin regions 716a and 718a with the conductive contacts 712b.

In some embodiments, the parallel backside vias 710 may have a width that is less than a width of the respective N-type/P-type fin regions 716a and 718a. In another embodiment, the parallel backside vias 710 over the cathode region 704 may have a width that is substantially equal to a width of the parallel backside vias 710 over the anode region 406. In an alternate embodiment, the parallel backside vias 710 over the cathode region 704 may have a width that is different than a width of the parallel backside vias 710 over the anode region 706.

In some embodiments, the parallel backside vias 710 may have a thickness that is substantially equal to a thickness of the respective N-type/P-type fin regions 716a and 718a. Likewise, in such embodiment, the parallel backside vias 710 may have a top surface that is substantially coplanar to a top surface of the respective N-type/P-type fin regions 716a and 718a. Furthermore, the conductive contacts 712a may be disposed on the top surfaces of the parallel backside vias 710 of the cathode region 704 and both of the N-type/P-type fin regions 716a and 718a, while the conductive contacts 712b may be disposed on the top surfaces of the parallel backside vias 710 of the anode region 706 and both of the N-type/P-type fin regions 716a and 718a. Additionally, the conductive contacts 712a may have a length that extends (and protrudes) over/beyond both the lengths of the N-type/P-type fin regions 716a and 718a and the parallel backside vias 710 of the cathode region 704, while the conductive contacts 712b may have a length that extends (and protrudes) over/beyond both the lengths of the N-type/P-type fin regions 716a and 718a and the parallel backside vias 710 of the anode region 706. In one embodiment, the conductive contacts 712a may have a length that is substantially equal to a length of the conductive contacts 712b. In an alternate embodiment, the conductive contacts 712a may have a length that is different than a length of the conductive contacts 712b.

For one embodiment, the parallel backside vias 710 may be entirely separated from the respective N-type/P-type fin regions 716a and 718a by an insulator material 703. The insulator material 703 may be substantially similar to the insulator material 203 described above in FIG. 2. The insulator material 703 may surround each of the parallel backside vias 710, where the insulator material 703 may be disposed adjacent to the outer, long-sided edges of each parallel backside vias 710 (as shown in the top-view of FIG. 7). Furthermore, in one embodiment, the insulator material 703 may be further disposed over the insulator region 702 to separate the N-type fin regions 716a with the N-type STI region 716b from the P-type fin region 718a with the P-type STI region 718b. In another embodiment, the insulator material 703 may be omitted from being disposed over the insulator region 702. Also, in an embodiment, the insulator material 703 has a thickness that is less than a thickness of the parallel backside vias 710 and the N-type/P-type fin regions 716a and 718a.

Note that the diode device 700 may include fewer, additional or alternative packaging components based on the desired packaging design.

As noted above, conventional three terminal STI BJTs, such as bandgap diodes, rely on silicon substrates to provide conduction between the emitter, base, and collector junctions/regions. In substrate-less technology as diode/transistor devices continue to shrink, these semiconductor substrates are completely polished off (or removed) which cuts off the conventional current paths. For example, as described above in conventional SOI FinFET lateral BJT devices, the subfin region below the epi portions is completely removed, leaving only highly doped epi portions on top of insulator regions. In these examples, the P-type (or P+) emitter and collector epis are separated by an oppositely background doped N-fin region which acts as the base region, where the current conduction path is typically limited to only the N-fin base region between the emitter and collector epi portions/contacts.

These SOI-based lateral BJT devices have several drawbacks, including (i) there is no way to contact and collect the base current in such designs (e.g., if an epi portion is grown, such portion would block the current path to the collector region; alternatively an N-tap might may be formed on the side, but such tap is not reflective of the true base current); (ii) the current flow and heat generation is limited to a very small volume, where the insulator region underneath the epi portion(s) prevent heat dissipation and thus is limited to much smaller range of currents; and (iii) the added constraints on the tunability of the BJT performance (e.g., an extra P+ emitter may be implanted to tune emitter-base junction characteristics, which in turn modulate the BJT performance metrics but adding to size, costs, etc., while in SOI devices the fin is completely etched out leaving only the P-type epi portions, and as such similar tunable features, such as the extra P+ emitters, are not present).

Accordingly, in the existing substrate-less technologies, the bulk of silicon (or the silicon substrate) is completely polished off which removes the conduction path of such BJT devices. This creates a need for new and improved approaches to construct three terminal FinFET-based lateral BJT devices. As such, as described below in FIGS. 8A-8B, 9, and 10A-10C, these embodiments provide lateral substrate-less BJT devices with backside contacts, such as backside metal regions for the emitter, collector, and base junctions, and backside vias and/or parallel backside vias. Such embodiments enable contacting/coupling the emitter, base and collector junctions of the BJT devices through the backside contacts.

Accordingly, embodiments described herein include improvements over existing processing technologies by (i) leaving the subfin region(s) under the epi portions, which contributes to the conduction process and also increases the current carrying capability and the thermal limits of the device, (ii) implementing the backside metal contacts under the active fin regions of the lateral BJT devices to act as heat sinks (e.g., as compared to the insulator regions underneath the conventional SOI lateral BJT devices), to help in reducing the routing resistance, and to increase the thermal capability with the subfin region(s) in the shallow isolation BJT devices, even though the active BJT fin region is on the insulator region (e.g., as compared to the conventional SOI-based lateral BJT devices); (iii) using an additional P+ implant for both the emitter and collector junction regions to prevent a short between the emitter/collector and base regions through the backside vias, where the doping species and energy can be modified to tune the property of the forward biased emitter-base junction and the performance of the lateral BJT devices; and (iv) allowing biasing and creating a base current through the subfin regions (e.g., as compared to the SOI lateral BJT devices).

FIGS. 8A-10C illustrate approaches to implement lateral BJT devices including subfin conduction with the backside metal contacts described herein. For example, one of the approaches includes initially forming an N-type fin region and then implementing special P+ implants to create the emitter and collector regions, while the N-fin region in the middle forms the base region. Such approach uses the formation of opposite type epi portions on the same fin region to be separated by the gate electrodes. Accordingly, the first P/N junction may be formed between the P+ emitter region and N-type base junction region, and the second P/N junction may be formed between the N-type base region and the P+ collector region. Note that, without the special P+ implants, there would be a short between the P+ emitter/P+ collector junction regions with the N-type fin base region through the backside metal contacts below the fin regions. As such, these embodiments of the lateral BJT transistor devices described below allow the formation of two back-to-back diode junctions within the same fin region, while the backside vias carry the current down to the respective backside metal contacts/regions, and the top-level metal routing over such fin regions in conjunction with the backside vias in a separate tap help collect the base current. An example of such an embodiment is shown in each of FIGS. 8A-10C. Also note that, in some views, portions of the fins, insulators, metals, and vias may have been removed in such devices for clarity.

Figure 8A:
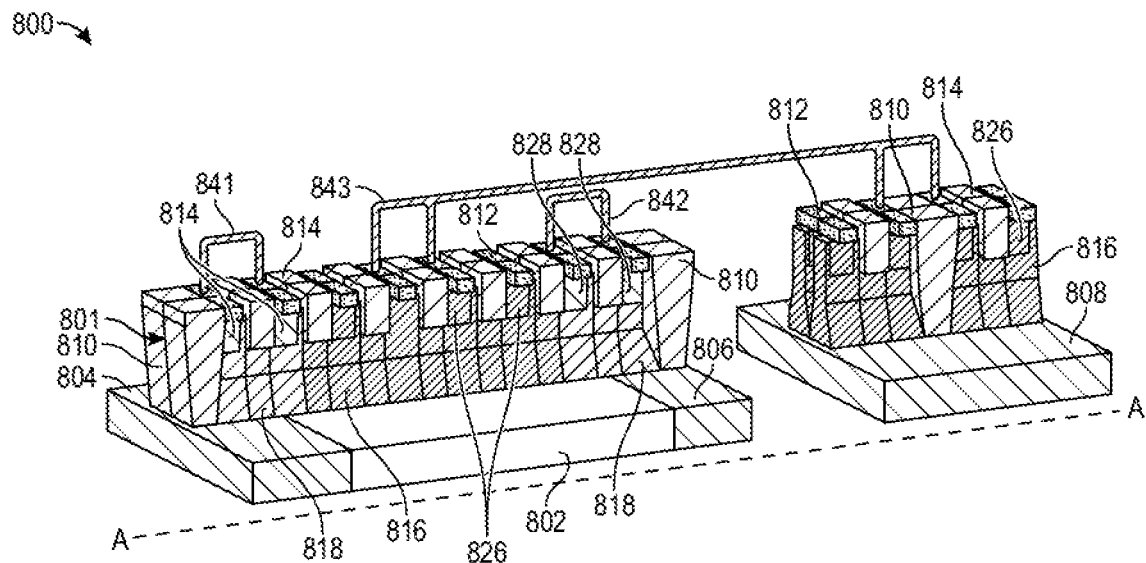
FIG. 8A is an illustration of a cross-sectional view and a respective plan view of a lateral three terminal bandgap diode with an emitter region, a collector region, a base region, an N-type fin region, a P-type fin region, and a plurality of backside vias, according to one embodiment.
Figure 8A:
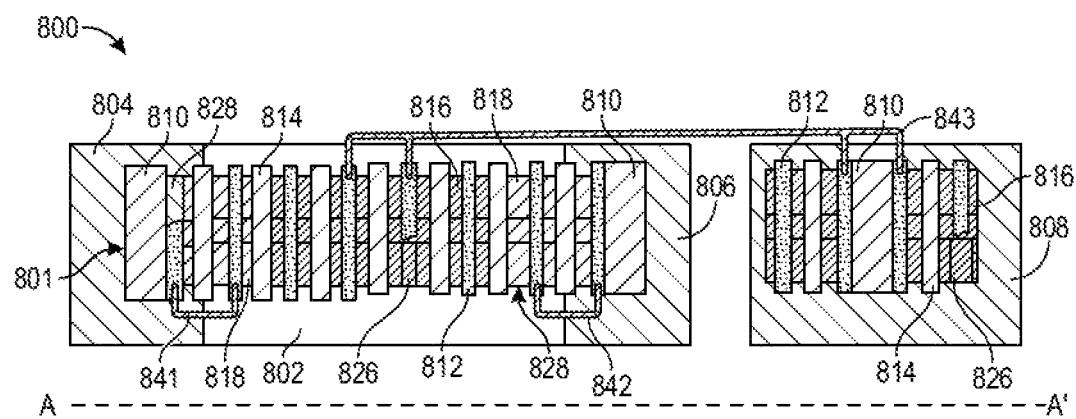

Referring now to FIG. 8A, a cross-sectional and respective top-view illustration of a transistor device 800 is shown, in accordance with an embodiment. Whereas in FIG. 8B, a respective cross-sectional view illustration of a fin region 801 of the transistor device 800 is shown, in accordance with an embodiment. In one embodiment, the transistor device 800 may be a substrate-less FinFET-based lateral BJT transistor device with backside vias. The transistor device 800 may include a substrate-less FinFET lateral diode device/design that may be substantially similar to the diode device 100 described above in FIG. 1 (and/or any other diode devices described above in FIG. 1-7).

Figure 8B:
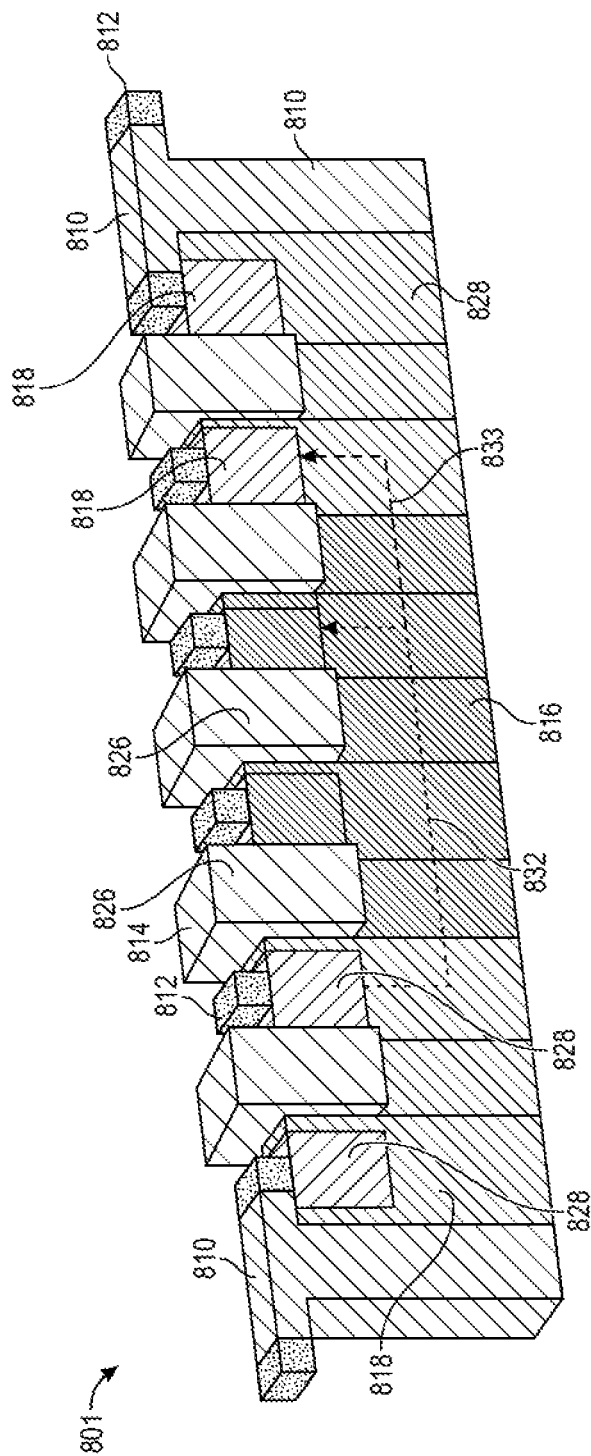
FIG. 8B is an illustration of a cross-sectional view of a current path through a respective lateral three terminal bandgap diode subfin with an emitter region, a collector region, a base region, an N-type fin region, a P-type fin region, and a plurality of backside vias, according to one embodiment.

That is, in some embodiments, the transistor device 800 may have an N-type fin region 816 and two P-type fin regions 818 that are coupled and disposed over an emitter region 804, an insulator region 802, and/or a collector region 806. In these embodiments, the N-type fin region 816 may be surrounded (e.g., on both opposite short-sided edges/sidewalls of the N-type fin region 816 as shown in the cross-sectional views of FIGS. 8A-8B) by one of the P-type fin regions 818 on the left-side of the N-type fin region 816, and the other of the two P-type fin regions 818 on the right-side of the N-type fin region 816 (as shown in FIGS. 8A-8B). Additionally, in one embodiment, the backside vias 810 may be disposed vertically on the emitter and collector regions 804 and 806 and positioned adjacent to the outer edges/sidewalls of both of the P-type fin regions 818. Likewise, in this embodiment, the transistor device 800 may also have the N-type fin region 816 disposed over a base region 808, where the backside via 810 may be disposed vertically on the base region 808 and positioned in between the N-type fin region 816. Accordingly, the transistor device 800 enables coupling (or contacting) the junctions of the emitter, collector, and base regions 804, 806, and 808 through the backside vias 810 and the routing lines 841-843.

For some embodiments, a plurality of N-type epi portions 826, a plurality of gate electrodes 814, and a plurality of P-type epi portions 828 are disposed over the N-type/P-type fin regions 816 and 818 of the insulator, emitter, and collector regions 802, 804, and 806, while the N-type epi portions 826 and the gate electrodes 814 are disposed over the N-type fin region 816 of the base region 808. Additionally, in an embodiment, a plurality of conductive contacts 812 are disposed over the N-type/P-type epi portions 826 and 828 and/or the N-type/P-type fin regions 816 and 818 of the insulator, emitter, collector, and base regions 802, 804, 806, and 808 to form the topside metal contacts of the transistor device 800. As shown in FIG. 8A, the gate electrodes 814 may be positioned between the conductive contacts 812, while the conductive contacts 812 may be positioned between the gate electrodes 814 and/or the backside vias 810.

As described above, in some embodiments, the transistor device 800 may initially dispose (or form) the N-type fin region 816 and then implant the P-type fin regions 818 to create the emitter and collector regions 804 and 806, while the N-type fin region 816 positioned in the middle forms the base region 808. Such embodiments may implement the formation of N-type/P-type epi portions 826 and 828 on the same/respective N-type/P-type fin regions 816 and 818 and may separate such N-type/P-type epi portions 826 and 828 with the gate electrodes 814. That is, the N-type/P-type epi portions 826 and 828 may be epitaxially grown on the same respective N-type/P-type fin regions 816 and 818, where the N-type epi portions 826 are disposed over the N-type fin regions 816, and the P-type epi portions 828 are respectively disposed over the P-type fin regions 818. Accordingly, as shown in FIG. 8B, a first P/N junction may be implemented between the P-type fin region 818 (or the P+ emitter region) and the N-type fin region 816 (or the N-type base junction region) (e.g., as shown with the P-type/N-type fin regions 818 and 816 over the interface of the emitter and insulator regions 804 and 802 on the left-side of FIG. 8A); and the second P/N junction may be implemented between the N-type fin region 816 (or the N-type base junction region) and the P-type fin region 818 (or the P+ collector region) (e.g., as shown with the P-type/N-type fin regions 818 and 816 over the interface of the insulator and collector regions 802 and 806 on the right-side of FIG. 8A). Note that, with the implants of the P-type fin regions 818, the transistor device 800 avoids a short between the P+ emitter/collector regions 804 and 806 with the N-type fin region 816 of the base region 808 through the backside metal contacts of the emitter, collector, and base regions 804, 806, and 808 below the respective N-type/P-type fin regions 816 and 818.

As such, in these embodiments described herein, the transistor device 800 (or the three terminal lateral BJT transistor device(s)) provides the formation of at least two back-to-back P/N diode junctions within the same fin (i.e. with the N-type/P-type fin regions 816 and 818 over the insulator, emitter, and collector regions 802, 804, and 806 as shown in FIG. 8A), while the top-level metal routing lines 842 over N-type fin region 818 in conjunction with the backside vias carry the current down (as shown with the arrows 833 in FIG. 8B) to the respective backside metal contacts of the emitter and collector regions 804 and 806, as the top-level metal routing lines 843 over such respective N-type/P-type fin regions 816 and 818 in conjunction with the backside vias 810 in a separate metal tap of the base region 808 help collect the base current (as shown with the arrows 832 in FIG. 8B). As noted above, the transistor device 800 may be implemented with a substrate-less FinFET diode array or a plurality of substrate-less FinFET diode devices as described herein, that is, where such diode device(s) implemented by the transistor device 800 may be substantially similar to the diode devices described above in FIGS. 1-7.

As such, the N-type/P-type fin regions 816 and 818, the N-type/P-type epi portions 826 and 828, the backside vias 810, the conductive contacts 812, the gate electrodes 814, the routing lines 841-843, and the insulator, emitter, collector, and base regions 802, 804, 806, and 808 of the transistor device 800 may be substantially similar to the N-type/P-type fin regions 116 and 118, the N-type/P-type epi portions 126 and 128, the backside vias 110, the conductive contacts 112, the gate electrodes 114, the routing lines 141-142, and the insulator, cathode, and anode regions 102, 104, and 106 of the diode device 100 in FIG. 1. That is, for example, the emitter, collector, and base regions 804, 806, and 808 may be formed of a conductive/metal region (or layer/portion) similar to the cathode and anode regions 104 and 106 in FIG. 1.

Note that the transistor device 800 and the fin region 801 of FIGS. 8A-8B may include fewer, additional or alternative packaging components based on the desired packaging design.

Figure 9A:
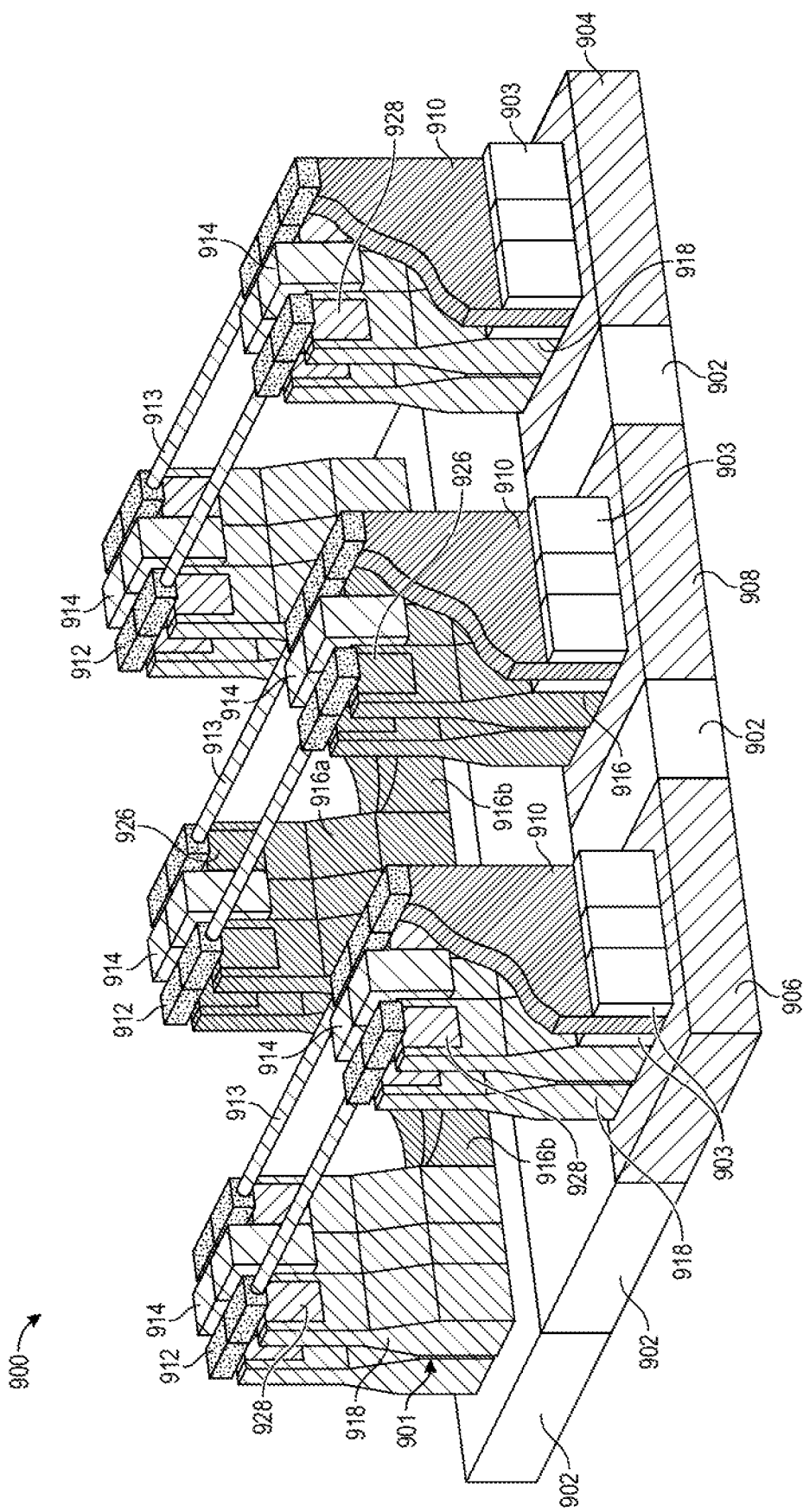
FIG. 9A is an illustration of a cross-sectional view of a shallow isolation three terminal bandgap diode with an emitter region, a collector region, a base region, an N-type fin region, a P-type fin region, and a plurality of parallel backside vias, according to one embodiment.

Referring now to FIG. 9A, a cross-sectional and respective top-view illustration of a transistor device 900 is shown, in accordance with an embodiment. Whereas in FIG. 9B, a respective cross-sectional view illustration of a fin region 901 of the transistor device 900 is shown, in accordance with an embodiment. In one embodiment, the transistor device 900 may be a substrate-less FinFET-based shallow isolation BJT transistor device with parallel backside vias. The transistor device 900 may be substantially similar to the transistor device 800 described above in FIG. 8A, with the exception that the N-type fin region 916a includes the STI regions 916b (or N-type shallow isolation regions), that the N-type fin region 916 is separated from the P-type fin regions 918, and that the N-type/P-type fin regions 916 and 918 are coupled to and adjacent to the parallel backside vias 910 that are disposed respectively on the metal taps of the collector, base, and emitter regions 906, 908, and 904.

Figure 9B:
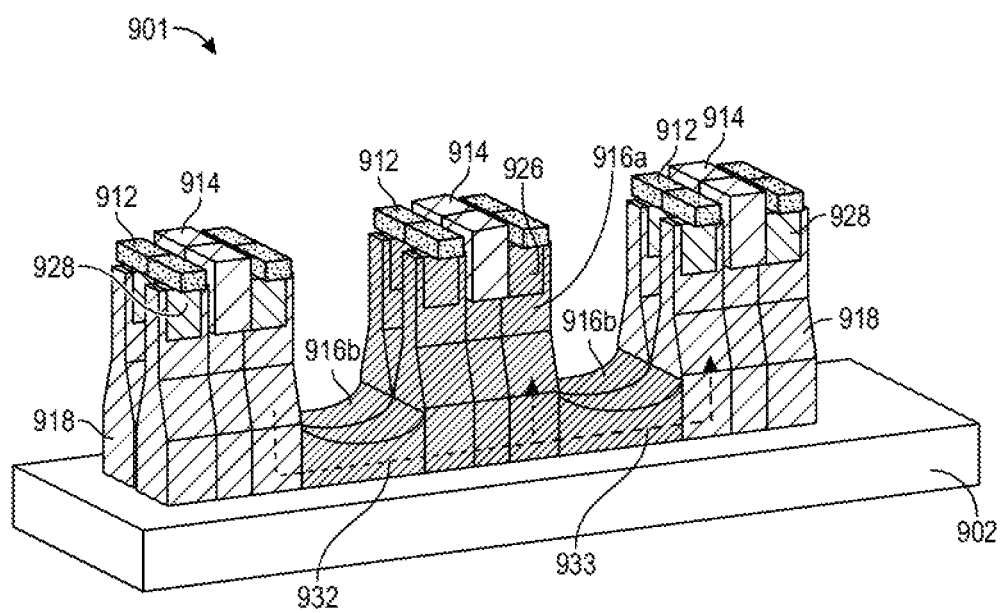
FIG. 9B is an illustration of a cross-sectional view of a current path through a respective shallow isolation three terminal bandgap diode subfin with an emitter region, a collector region, a base region, an N-type fin region, a P-type fin region, and a plurality of parallel backside vias, according to one embodiment.

That is, in some embodiments, the transistor device 900 may have the N-type fin region 916a and two P-type fin regions 918 coupled with the STI regions 916b and disposed over an insulator region 902 (e.g., such as an active bandgap diode device on the insulator region 902). In these embodiments, the N-type fin region 916a with the STI regions 916b (on each side of the N-type fin region 916a as shown in FIGS. 9A-9B) may be surrounded by one of the P-type fin regions 918 on the left-side of the STI region 916b of the N-type fin region 916a, and the other P-type fin region 918 on the right-side of the STI region 916b of the N-type fin region 916 (as shown in FIGS. 9A-9B). Note that such embodiments may create a PNP BJT, alternatively an NPN BJT may also be created.

Additionally, in one embodiment, the transistor device 900 may also have the N-type fin region 916 and two P-type fin regions 918 disposed over the collector, base, and emitter regions 906, 908, and 904. In an embodiment, the collector, base, and emitter regions 906, 908, and 904 may be separated with the insulator region(s) 902, where such collector, base, and emitter regions 906, 908, and 904 may be conductive/metal taps of the transistor device 900. In these embodiments, the N-type fin region 916 may be disposed over the base region 903, and may be positioned between one of the P-type fin regions 918 on the left-side that is disposed over the collector region 906, and the other P-type fin region 918 on the right-side that is disposed over the emitter region 904.

Additionally, for some embodiments, the parallel backside vias 910 may be disposed vertically on the collector, base, and emitter regions 906, 908, and 904 and positioned adjacent to the P-type fin region 918 (on the left-side), the N-type-fin region 916, and the P-type fin region (on the right-side) that are also respectively disposed on such collector, base, and emitter regions 906, 908, and 904. As described above, the parallel backside vias 910 may be isolated (on the metal taps) and separated from the respective N-type/P-type fin regions 916 and 918 with the insulator material 903. Accordingly, the transistor device 900 enables coupling (or contacting) the junctions of the collector, base, and emitter regions 906, 908, and 904 through the parallel backside vias 910 and the routing lines 913. For example, the parallel backside vias 910 may be used to carry current to the backside contacts of the collector, base, and emitter regions 906, 908, and 904, while the separate isolated N-type/P-type fin regions 916a and 918 may be used to collect the current and supply it to the backside vias 910 through the routing lines 913. That is, as shown in FIG. 9B, the parallel backside vias 910 with the respective N-type/P-type fin regions 916a/916 and 918 may carry the collector current down (as shown with the arrows 933) and the respective backside metal contacts of the emitter and collector regions 904 and 906, as the respective N-type fin regions 916 and 916a in conjunction with the parallel backside vias 910 of the base region 908 may help collect the base current (as shown with the arrows 932).

For some embodiments, similar to the transistor device 800 in FIGS. 8A-8B, the N-type epi portions 926, the gate electrodes 914, and the P-type epi portions 928 are disposed respectively over the N-type/P-type fin regions 916a/916 and 918. Additionally, in an embodiment, the conductive contacts 912 are disposed over the N-type/P-type epi portions 926 and 928 and/or the parallel backside vias 910 of the collector, base, and emitter regions 906, 908, and 904 to form the topside metal contacts of the transistor device 900. As shown in FIGS. 9A-9B, the gate electrodes 914 may be positioned between the conductive contacts 912, while the conductive contacts 912 may be positioned on the top outer edges of the respective N-type/P-type fin regions 916a/916 and 918. Additionally, in one embodiment as shown in FIG. 9A, the routing lines 913 disposed on the left-side of the respective N-type/P-type fin regions 916a/916 and 918 may be isolated from the parallel backside vias 910, where these routing lines 913 (on the left-side of such fin regions) may only be disposed over and coupled to the N-type/P-type epi portions 926 and 928; meanwhile the other routing lines 913 disposed on the right-side of the respective N-type/P-type fin regions 916a/916 and 918 may be conductively coupled to the parallel backside vias 910, where these routing lines 913 (on the right-side of such fin regions) may be disposed over and coupled to both the respective N-type/P-type epi portions 926 and 928 and the top surfaces of the parallel backside vias 910.

As noted above, the transistor device 900 may be implemented with a substrate-less FinFET diode array or a plurality of substrate-less FinFET diode devices as described herein, that is, where such diode device(s) implemented by the transistor device 900 may be substantially similar to the diode/transistor devices described above in FIGS. 1-8B. As such, the N-type/P-type fin regions 916a/916 and 918, the STI regions 916b, the N-type/P-type epi portions 926 and 928, the parallel backside vias 910, the conductive contacts 912, the gate electrodes 914, the routing lines 913, the insulator material 903, and the insulator, emitter, collector, and base regions 902, 904, 906, and 908 of the transistor device 900 may be substantially similar to the N-type/P-type fin regions 716a/116 and 118, the N-type STI regions 716b, the N-type/P-type epi portions 126 and 128, the parallel backside vias 710, the conductive contacts 112, the gate electrodes 114, the routing lines 141-142, the insulator material 703, and the insulator, emitter, collector, and base regions 802, 804, 806, and 808 of the diode/transistor devices 100, 700, and 800 in FIGS. 1 and 7-8A.

Note that the transistor device 900 and the fin region 801 of FIGS. 8A-8B may include fewer, additional or alternative packaging components based on the desired packaging design.

Figure 10A:
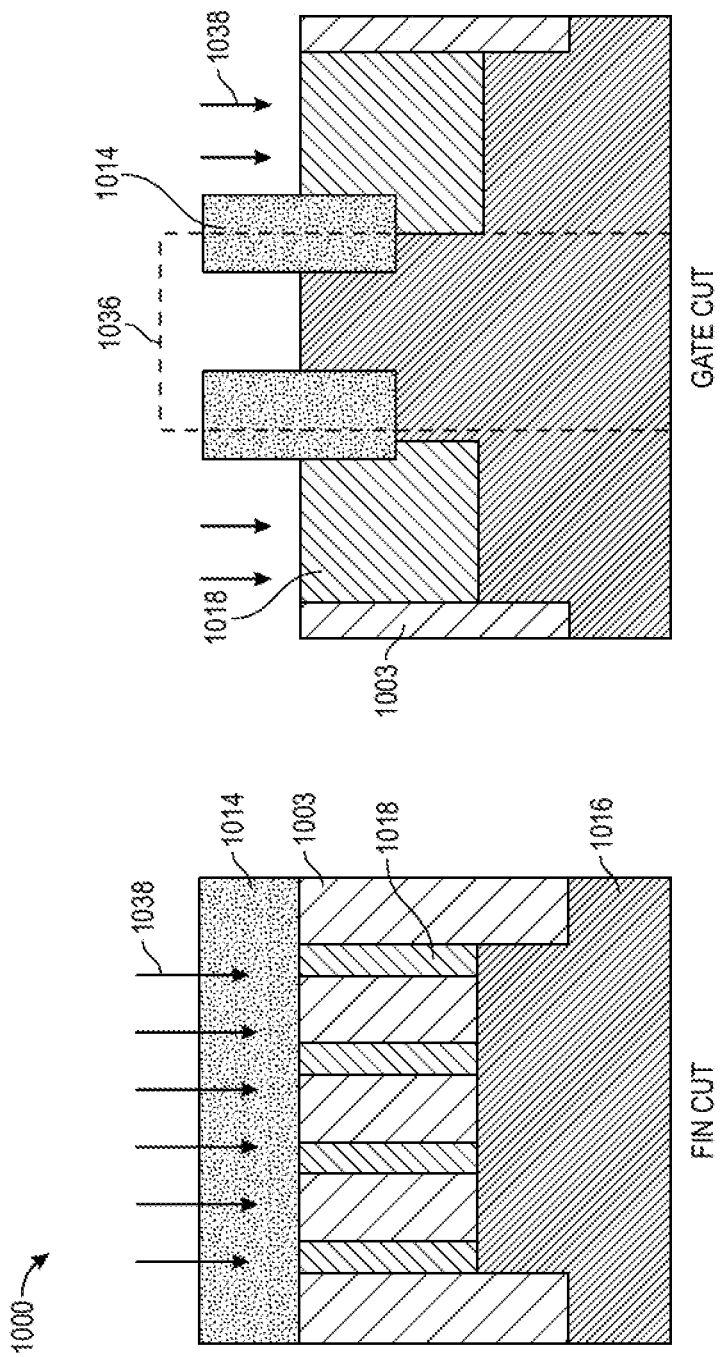
FIGS. 10A-10C are respective fin and gate cross-sectional views of a process flow to form a lateral diode with an N-type fin region, a P-type fin region, and a plurality of backside vias, where the plurality of backside vias are positioned on the outer edges of the respective N-type and P-type fin regions, according to some embodiments.
Figure 10B:
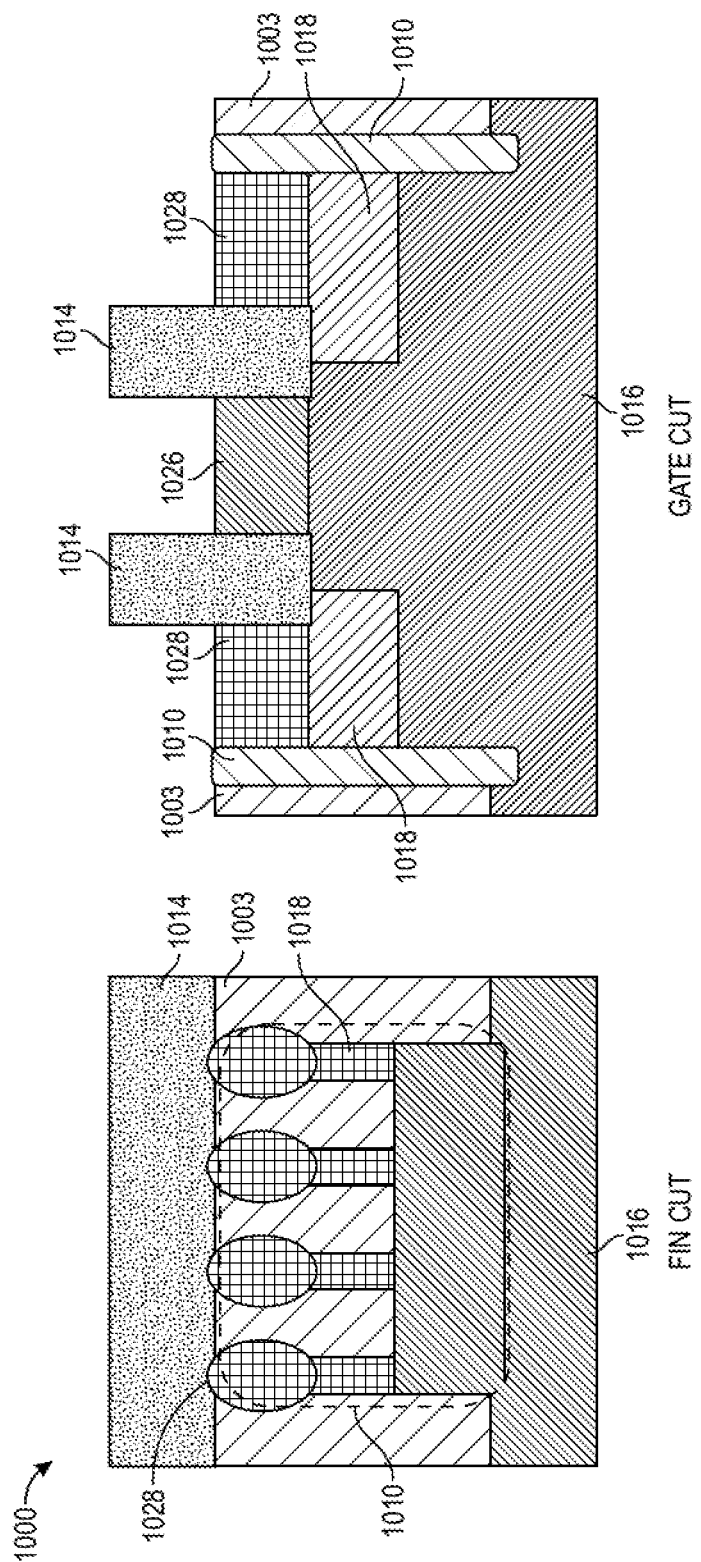
Figure 10C:
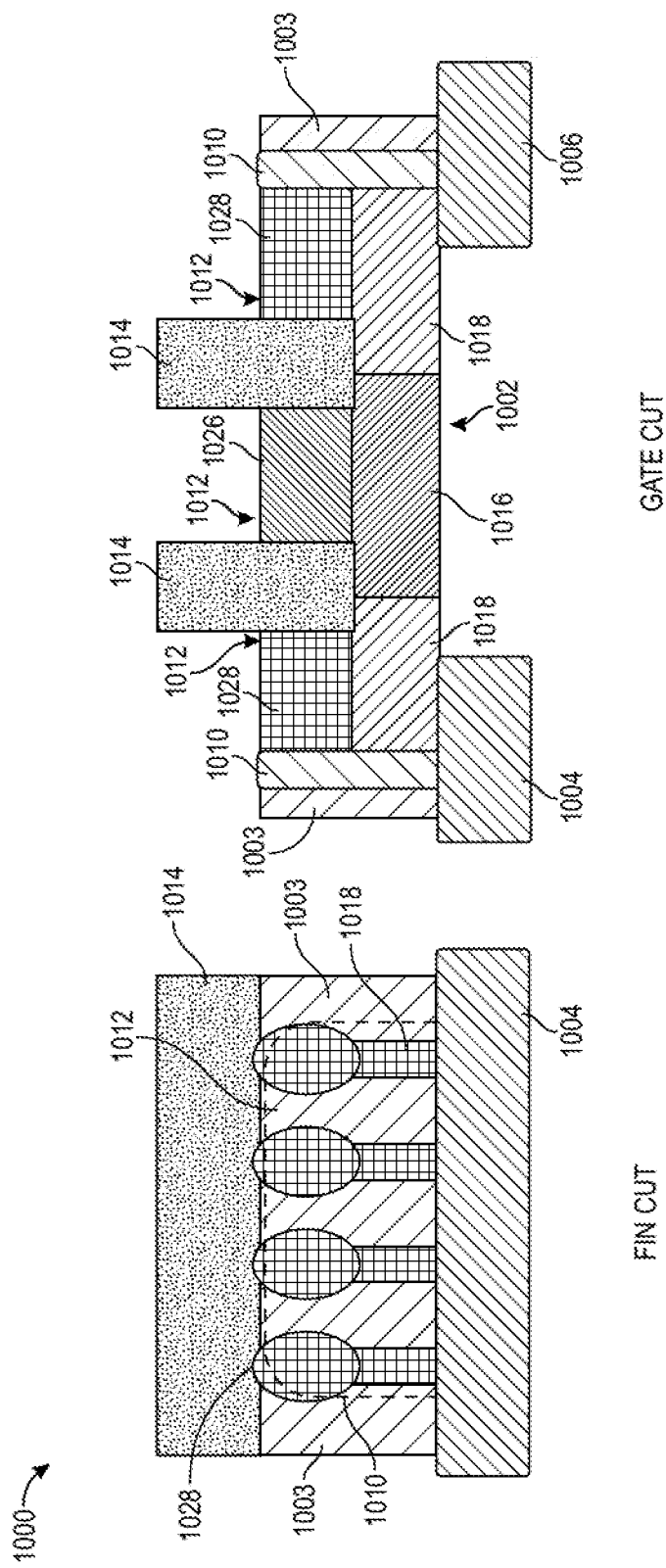

Referring now to FIGS. 10A-10C, are a series of cross-sectional fin and gate view illustrations that depict a transistor device 1000, according to some embodiments. The process flow illustrated in FIGS. 10A-10C form the transistor device 1000 that is similar to the transistor device 800 described above in FIGS. 8A-8B. Accordingly, as described above, this process flow of the transistor device 1000 illustrates one of the approaches that enables implementing a substrate-less FinFET-based lateral BJT transistor device with backside vias. That is, in some embodiments, the transistor device 1000 may have N-type fin regions, P-type fin regions, and backside vias that are coupled and disposed over an emitter region, an insulator region, a collector region, and/or a base region, according to some embodiments.

Referring now to FIG. 10A, a series of cross-sectional fin and gate illustrations of a transistor device 1000 is shown, in accordance with an embodiment. In an embodiment, the transistor device 1000 may initially include a N-type fin region 1016, where the N-type fin region 1016 may be an N-type-well (or N-well) region that has been doped (or created) in a P-type region (or a P-type substrate). In one embodiment, the transistor device 1000 may dispose a plurality of P-type fin regions 1018 and a plurality of insulator regions 1003 (or insulator materials) over the N-type fin region 1016, where the P-type fin regions 1018 may be shallow P-type (or P+) doped regions, and where the insulator regions 1003 may be disposed directly over the N-type fin region 1016 and positioned on the outer edges of the transistor device 1000 and surrounding the P-type fin regions 1018. In addition, a plurality of gate electrodes 1014 may be disposed (or formed/created) over the N-type/P-type fin regions 1016 and 1018. In one embodiment, as described above, the N-type/P-type fin regions 1016 and 1018, the gate electrodes 1014, and the insulator regions/materials 1003 may be substantially similar to the N-type/P-type fin regions 816 and 818, the gate electrodes 814, and the insulator regions/materials 802 described above in FIG. 8A.

In addition, as shown in the fin-cut illustration of FIG. 10A, the gate electrodes 1014 may be disposed on the P-type fin regions 1018 and the insulator regions 1003. Lastly, in some embodiments, the transistor device 1000 may implement a P+ doping energy 1038 (or P+ doping species/concentration) over/above the P-type fin regions 1018 to form the emitter and collector regions that are subsequently shown below in FIG. 10B, while a region 1036 may be blocked (or covered) from the P+ doping energy 1038 (or P+ doping exposure) to form the N-type epi portion that is subsequently shown below in FIG. 10B.

Referring now to FIG. 10B, a series of cross-sectional fin and gate illustrations of a transistor device 1000 is shown, in accordance with an embodiment. In an embodiment, a plurality of P-type epi portions 1028 may be disposed over the P-type fin regions 1018, where such P-type epi portions 1028 may be formed (or implanted) with the P+ doping energy 1038 described above. For example, as shown in the fin cut illustration of FIG. 10B, the P-type epi portions 1028 may be disposed over the P-type fin regions 1018, where the P-type epi portions 1028 may be embedded (or surrounded) with the insulator regions 1003, the gate electrode(s) 1014, and the backside vias 1010. Additionally, in an embodiment, an N-type epi portion(s) 1026 may be disposed over the N-type fin region 1016 and surrounded (and positioned/located) between the gate electrodes 1014. Note that, in one embodiment, the background doping of the N-type/P-type fin region(s) may be used to define the base region and the regions (or areas) of the individually doped junctions of the transistor device 1000. In some embodiments, a plurality of backside vias 1010 may be disposed over the N-type fin region 1016 and surrounding the P-type fin regions 1018 and the P-type epi portions 1028.

As described above, such embodiments may implement the formation of N-type/P-type epi portions 1026 and 1028 on the same/respective N-type/P-type fin regions 1016 and 1018 and may separate such N-type/P-type epi portions 1026 and 1028 with the gate electrodes 1014. That is, the N-type/P-type epi portions 1026 and 1028 may be epitaxially grown on the same respective N-type/P-type fin regions 1016 and 1018, where the N-type epi portions 1026 are disposed over the N-type fin regions 1016, and the P-type epi portions 1028 are respectively disposed over the P-type fin regions 1018, where a first P/N junction may be implemented between the P-type fin region 1018 (or the P+ emitter region) and the N-type fin region 1016 (or the N-type base junction region), and the second P/N junction may be implemented between the N-type fin region 1016 (or the N-type base junction region) and the P-type fin region 1018 (or the P+ collector region).

Referring now to FIG. 10C, a series of cross-sectional fin and gate illustrations of a transistor device 1000 is shown, in accordance with an embodiment. In an embodiment, the transistor device 1000 may remove the substrate portion of the N-type fin region 1016, where the remaining N-type fin region 1016 may be substantially embedded by the P-type fin regions 1018. The removal of the substrate may be implemented with an etch process, a polishing process, or any similar removal/polishing process, where such backside polish may be modulated based on the desired thickness (or z-height) of the fin/subfin regions. Additionally, an emitter region 1004 and a collector region 1006 may be disposed below the P-type fin regions 1018 and the backside vias 1010. In one embodiment, an insulator region 1002 may be disposed between the emitter and collector regions 1004 and 1006. In another embodiment, a plurality of conductive contacts 1012 may be disposed over the respective N-type/P-type epi portions 1026 and 1028.

As such, as described above, the transistor device 1000 may be implemented as a three terminal lateral BJT transistor device with at least two back-to-back P/N diode junctions within the same fin (i.e. with the N-type/P-type fin regions 1016 and 1018 over the insulator, emitter, and collector regions 1002, 1004, and 1006), while the backside vias 1010 carry the current to the respective backside metal contacts of the emitter and collector regions 1004 and 1006, as the top-level metal routing lines (not shown) over such respective N-type/P-type fin regions 1016 and 1018 in conjunction with the backside vias 1010 in the separate metal contact of the base region (e.g., as shown with the base region 808 of FIG. 8A) may help collect the base current.

For one embodiment, the N-type/P-type fin regions 1016 and 1018, the N-type/P-type epi portions 1026 and 1028, the backside vias 1010, the conductive contacts 1012, the gate electrodes 1014, and the insulator, emitter, and collector regions 1002, 1004, and 1006 (and the base region not shown) of the transistor device 1000 may be substantially similar to the N-type/P-type fin regions 816 and 818, the N-type/P-type epi portions 826 and 828, the backside vias 810, the conductive contacts 812, the gate electrodes 814, and the insulator, emitter, collector, and base regions 802, 804, 806 and 808 of the transistor device 800 in FIGS. 8A-8B. Note that the transistor device 1000 enables that the fin/subfin regions may act as a conduction path (e.g., the carriers may be collected at the collector node, where, at higher biases, the collector current may be larger than the base current indicating a beta greater than 1, a key metric of such device).

Also note that the transistor device 1000 may include fewer, additional or alternative packaging components based on the desired packaging design.

Figure 11B:
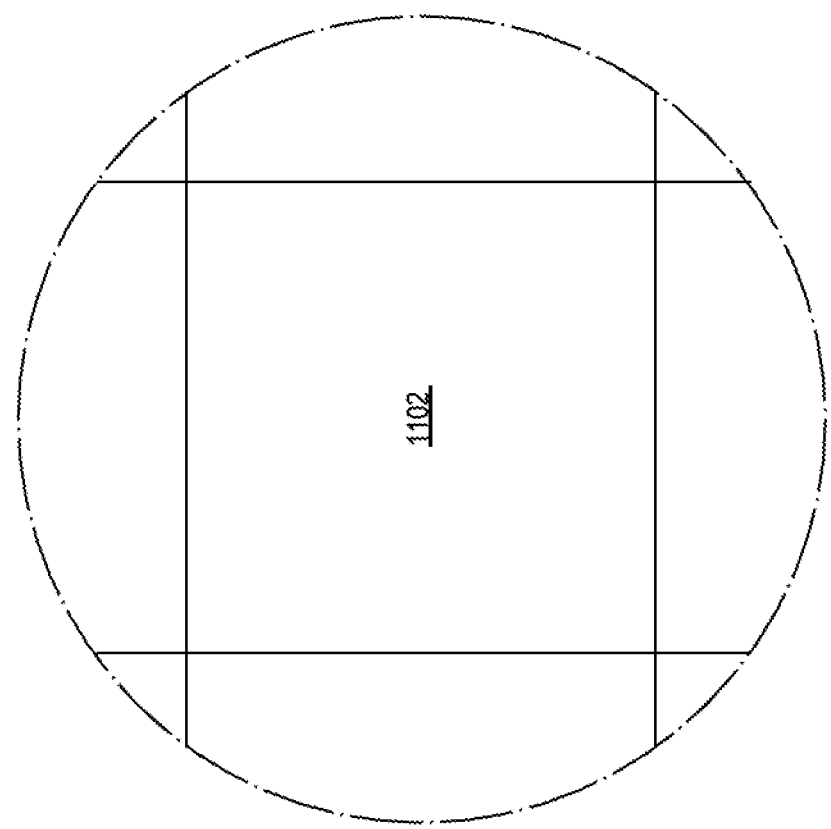
FIGS. 11A and 11B are illustrations of top views of an electronic device having a wafer and dies that also includes a plurality of diodes, according to some embodiments.
Figure 11A:
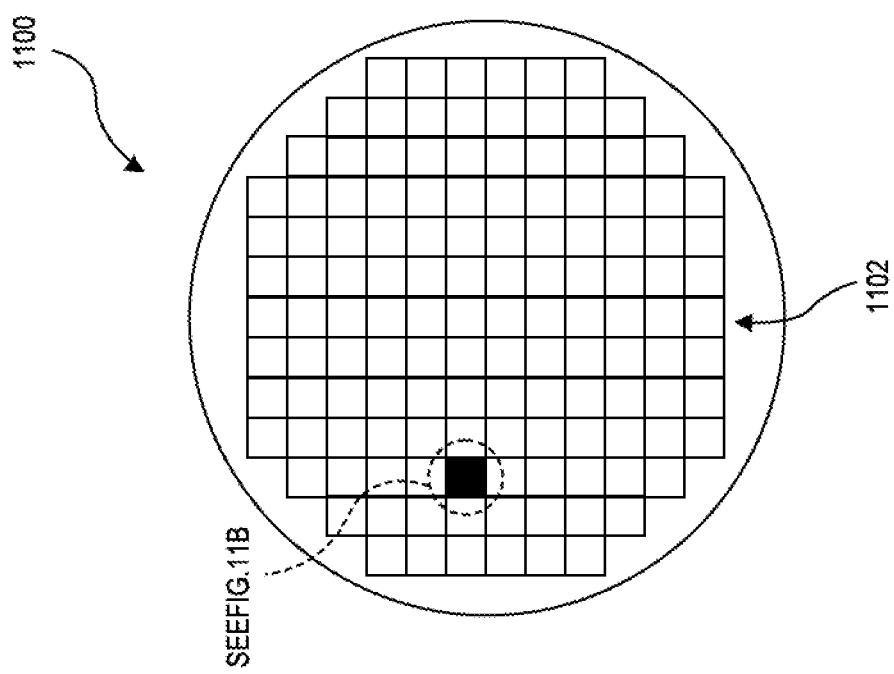

Referring now to FIGS. 11A-11B. The integrated circuit structures described herein may be included in an electronic device. As an example of one such apparatus, FIGS. 11A and 11B are top views of a wafer and dies that include one or more transistor devices with a plurality of diodes, in accordance with one or more of the embodiments described herein.

As illustrated in FIGS. 11A-11B, a wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., ICs with one or more transistor devices having a plurality of diodes as described above). After the fabrication of the semiconductor product is complete, the wafer 1100 may undergo a singulation process in which each of the dies 1102 is separated from one another to provide discrete "chips" of the semiconductor product. In particular, structures that include embedded non-volatile memory structures having an independently scaled selector as described herein may take the form of the wafer 1100 (e.g., not singulated) or the form of the die 1102 (e.g., singulated). The die 1102 may include one or more embedded non-volatile memory structures based independently scaled selectors and/or supporting circuitry to route electrical signals, as well as any other IC components. In some embodiments, the wafer 1100 or the die 1102 may include an additional memory device (e.g., SRAM device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device or other logic that is configured to store information in the memory devices or execute instructions stored in the memory array.

Embodiments described herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches described herein.

Note that the wafer 1100 and/or the die 1102 of FIGS. 11A-11B may include fewer or additional components and/or or materials based on the desired packaging design.

Figure 12:
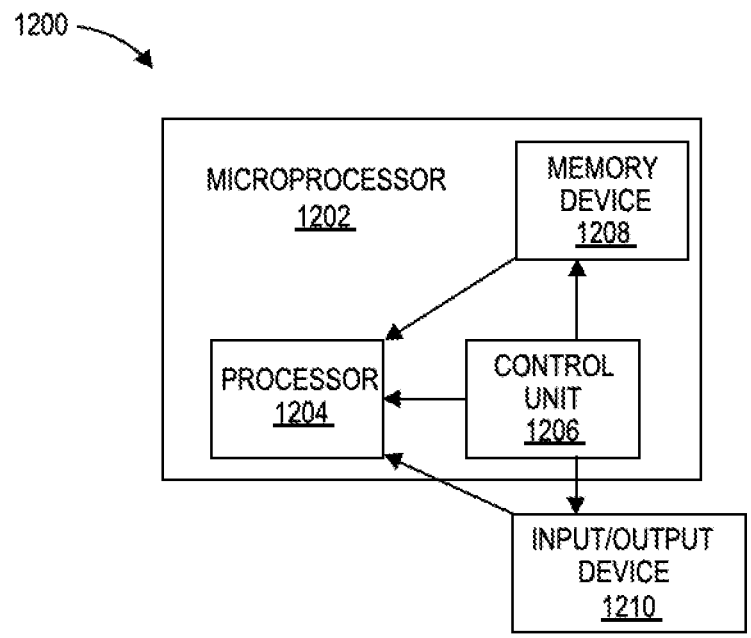
FIG. 12 is a schematic block diagram illustrating an electronic system that utilizes an input/output (I/O) device and a semiconductor package, which includes a processor, a memory device, and a control unit, according to one embodiment.

FIG. 12 is a schematic block diagram illustrating an electronic system 1200 that utilizes an I/O device 1210 and a microprocessor 1202, which includes a processor 1204, a memory device 1208, and a control unit 1206, according to one embodiment. FIG. 12 is an illustration of an electronic system 1200, according to one embodiment. The electronic system 1200 can correspond to, for example, a portable system, a computer system, a process control system, or any other system that utilizes a processor and an associated memory. The electronic system 1200 may include the microprocessor 1202, the processor 1204, the control unit 1206, the memory device 1208, and the I/O device 1210. Note that it is to be appreciated that the electronic system 1200 may have a plurality of processors, control units, memory device units, and/or I/O devices in various embodiments. In one embodiment, the electronic system 1200 has a set of instructions that define operations which are to be performed on data by the processor 1204, as well as, other transactions between the processor 1204, the memory device 1208, and the I/O device 1210. The control unit 1206 coordinates the operations of the processor 1204, the memory device 1208 and the I/O device 1210 by cycling through a set of operations that cause instructions to be retrieved from the memory device 1208 and executed. The memory device 1208 can include a substrate (e.g., such device may also include the diode/transistor devices as described above in FIGS. 1-10C). In an embodiment, the memory device 1208 is embedded in the microprocessor 1202, as illustrated in FIG. 12. In another embodiment, the processor 1204, or another component of the electronic system 1200 may include a substrate with a plurality of diode/transistor devices, such as those described herein.

Note that the electronic system 1200 of FIG. 12 may include fewer or additional packaging components and/or materials based on the desired packaging design.

Figure 13:
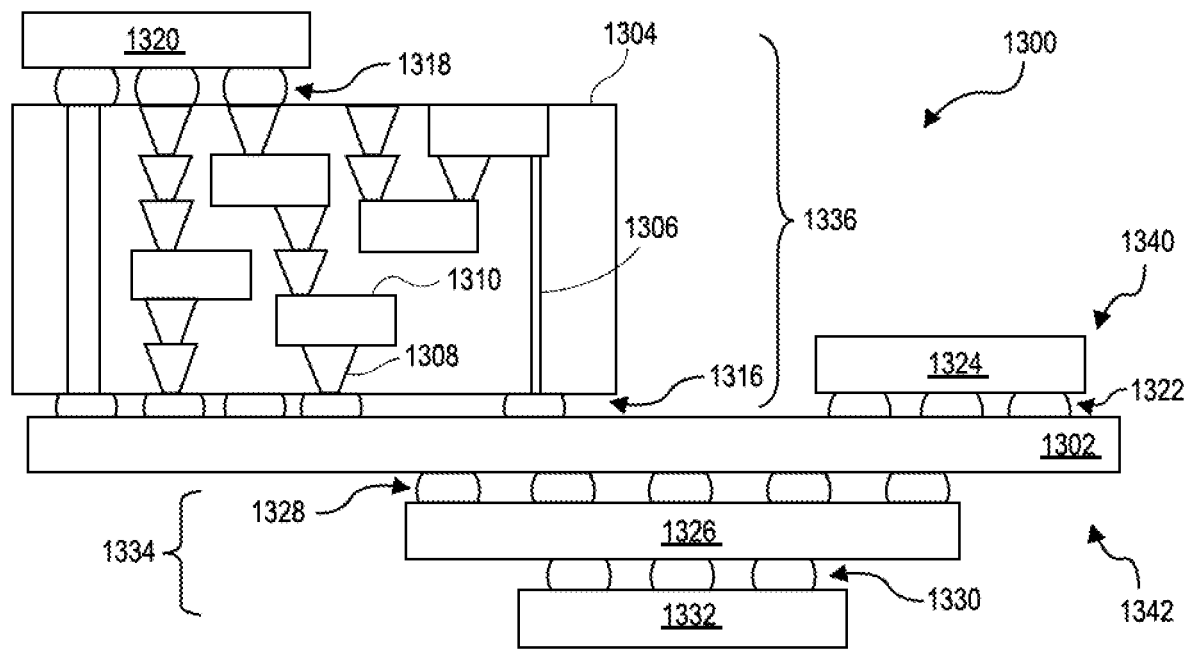
FIG. 13 is a cross-sectional view of an integrated circuit (IC) device assembly that includes a plurality of diodes, according to one embodiment.

FIG. 13 is a cross-sectional side view of an IC device assembly which may include one or more diode and/or transistor devices (as described above), in accordance with one or more of the embodiments described herein. As illustrated in FIG. 13, an IC device assembly 1300 includes components having one or more IC structures as described herein. The IC device assembly 1300 includes a number of components disposed on a circuit board 1302 (e.g., a motherboard). The IC device assembly 1300 includes components disposed on a first face 1340 of the circuit board 1302 and an opposing second face 1342 of the circuit board 1302. Generally, components may be disposed on one or both faces 1340 and 1342. In particular, any suitable ones of the components of the IC device assembly 1300 may include a number of CMOS structures, such as the substrate-less FinFET diodes and/or transistor devices as described herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 13 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 13), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 13, multiple IC packages may be coupled to the interposer 1304. Note that it is to be appreciated that additional interposers may be coupled to the interposer 1304. The interposer 1304 may provide an intervening substrate used to bridge the circuit board 1302 and the IC package 1320. The IC package 1320 may be or include, for example, a die (e.g., the die 502 of FIG. 5B), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiments illustrated in FIG. 13, the IC package 1320 and the circuit board 1302 are attached to opposing sides of the interposer 1304. In other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1310 and vias 1308, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, ESD devices, and memory devices. More complex devices such as radio-frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments described above with reference to the IC package 1320.

The IC device assembly 1300 illustrated in FIG. 13 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 described above. The package-on-package structure 1334 may be configured in accordance with any of the package-on-package structures known in the art.

Note that the IC device assembly 1300 of FIG. 13 may include fewer or additional packaging components and/or materials based on the desired packaging design.

Figure 14:
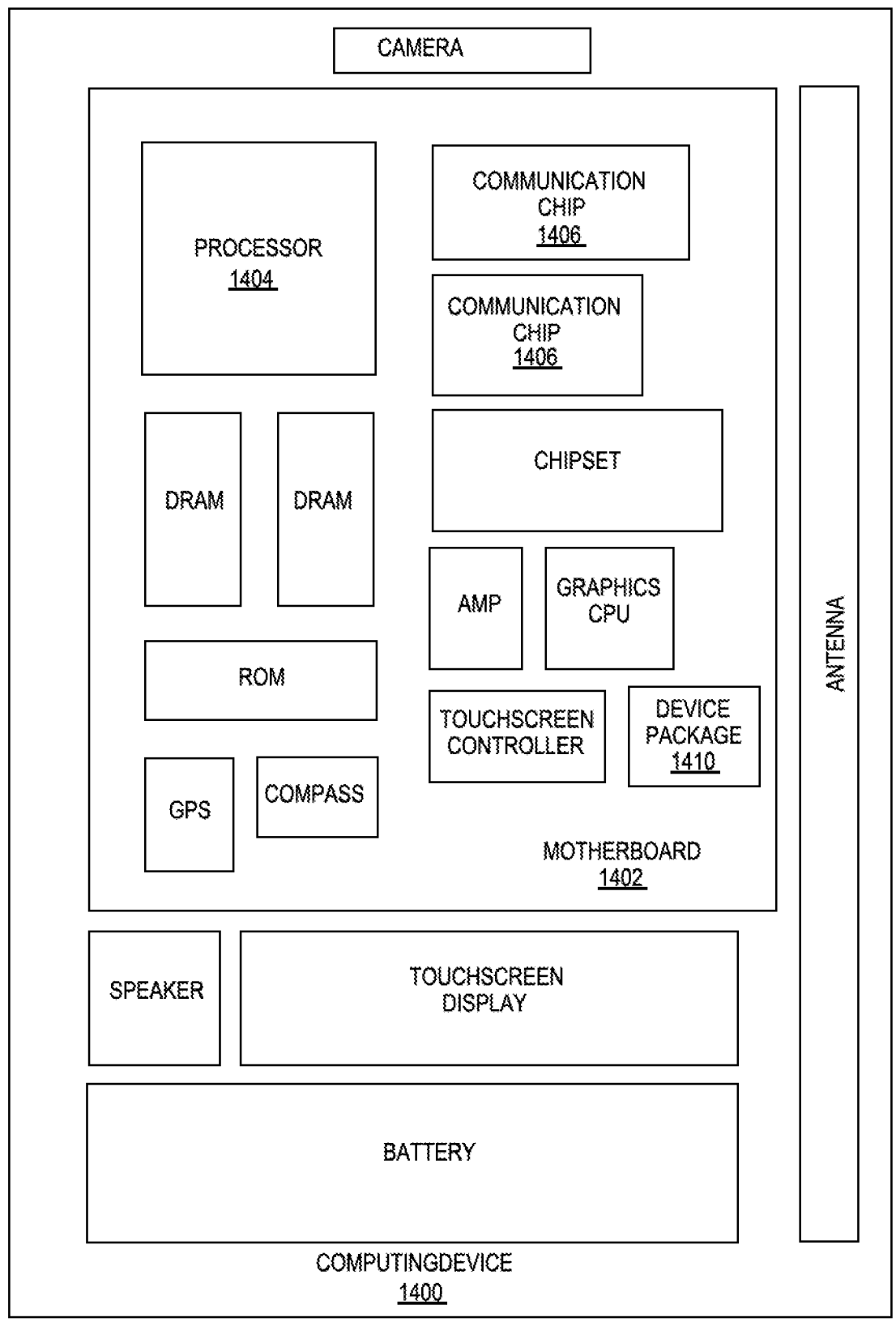
FIG. 14 is a schematic block diagram illustrating a computer system that utilizes a device package having a plurality of diodes, according to one embodiment.

FIG. 14 is a schematic block diagram illustrating a computer system 1400 that utilizes a device package 1410 having a plurality of diode devices and/or a plurality of transistor devices, according to one embodiment. FIG. 14 illustrates an example of computing device 1400. Computing device 1400 houses motherboard 1402. For one embodiment, motherboard 1402 may be similar to the circuit board 1402 of FIG. 14. Motherboard 1402 may include a number of components, including but not limited to processor 1404, device package 1410, and at least one communication chip 1406. Processor 1404 is physically and electrically coupled to motherboard 1402. For some embodiments, at least one communication chip 1406 is also physically and electrically coupled to motherboard 1402. For other embodiments, at least one communication chip 1406 is part of processor 1404.

Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1406 enables wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

Processor 1404 of computing device 1400 includes an integrated circuit die packaged within processor 1404. Device package 1410 may be, but is not limited to, a substrate, a package substrate, a CMOS package, a microelectronic device, and/or a PCB. Device package 1410 may include substrate-less FinFET diodes and/or transistor devices as described herein (e.g., as illustrated in FIGS. 1-10C). Device package 1410 may also include any other components from the Figures described herein.

Note that device package 1410 may be a single component/device, a subset of components, and/or an entire system, as the materials, features, and components may be limited to device package 1410 and/or any other component of the computing device 1400 that may need such diode and/or transistor devices as described above (e.g., the motherboard 1402, the processor 1404, and/or any other component of the computing device 1400).

For certain embodiments, the integrated circuit die may be packaged with one or more devices on a substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 1406 also includes an integrated circuit die packaged within the communication chip 1406. For some embodiments, the integrated circuit die of the communication chip may be packaged with one or more devices on a substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a diode device, comprising: a first fin region over a first conductive region and an insulator region; a second fin region over a second conductive region and the insulator region, wherein the second fin region is laterally adjacent to the first fin region, and wherein the insulator region is between the first conductive region and the second conductive region; a first conductive via on the first conductive region, wherein the first conductive via is vertically adjacent to the first fin region; and a second conductive via on the second conductive region, wherein the second conductive via is vertically adjacent to the second fin region.

In example 2, the subject matter of example 1 can optionally include a plurality of first portions on the first fin region; a plurality of second portions on the second fin region; a plurality of gate electrodes over the first and second fin regions, wherein the plurality of gate electrodes are between the plurality of first and second portions; and a plurality of conductive contacts over the plurality of first and second portions and the first and second fin regions, wherein the plurality of gate electrodes are between the plurality of conductive contacts.

In example 3, the subject matter of examples 1-2 can optionally include that the first and second conductive vias are coupled to the plurality of conductive contacts.

In example 4, the subject matter of examples 1-3 can optionally include that the first fin region includes a first N-type doped material, and wherein the second fin region includes a first P-type doped material.

In example 5, the subject matter of examples 1-4 can optionally include that the plurality of first portions includes a second N-type doped material, and wherein the plurality of second portions includes a second P-type doped material.

In example 6, the subject matter of examples 1-5 can optionally include that the plurality of gate electrodes includes a polysilicon material.

In example 7, the subject matter of examples 1-6 can optionally include a plurality of conductive lines over the plurality of conductive contacts.

In example 8, the subject matter of examples 1-7 can optionally include that the first conductive region is a cathode region, wherein the second conductive region is an anode region, and wherein the first fin region has an interface sidewall that is directly adjacent and coupled to an interface sidewall of the second fin region.

In example 9, the subject matter of examples 1-8 can optionally include that the first and second conductive vias have a top surface that is substantially coplanar to a top surface of the plurality of conductive contacts.

In example 10, the subject matter of examples 1-9 can optionally include that the first conductive via is conductively coupled to the cathode region, wherein the second conductive via is conductive coupled to the anode region, and wherein the interface sidewalls of the first and second fin regions is positioned over the insulator region.

Example 11 is a diode device, comprising: a first fin region over a first conductive region and an insulator region; a second fin region over a second conductive region and the insulator region, wherein the second fin region is laterally adjacent to the first fin region, and wherein the insulator region is between the first conductive region and the second conductive region; a first conductive via over the first conductive region, wherein the first conductive via is parallelly adjacent to the first fin region; and a second conductive via over the second conductive region, wherein the second conductive via is parallelly adjacent to the second fin region.

In example 12, the subject matter of example 11 can optionally include a plurality of first portions on the first fin region; a plurality of second portions on the second fin region; a plurality of gate electrodes over the first and second fin regions, wherein the plurality of gate electrodes are between the plurality of first and second portions; a plurality of conductive contacts over the plurality of first and second portions, the first and second fin regions, and the first and second conductive vias, wherein the plurality of gate electrodes are between the plurality of conductive contacts; and an insulator material over the first conductive region and the second conductive region, wherein the insulator material is between the first conductive via and the first fin region, and wherein the insulator material is between the second conductive via and the second fin region.

In example 13, the subject matter of examples 11-12 can optionally include that the first and second conductive vias are coupled to the plurality of conductive contacts.

In example 14, the subject matter of examples 11-13 can optionally include that the first fin region includes a first N-type doped material, and wherein the second fin region includes a first P-type doped material.

In example 15, the subject matter of examples 11-14 can optionally include that the plurality of first portions includes a second N-type doped material, and wherein the plurality of second portions includes a second P-type doped material.

In example 16, the subject matter of examples 11-15 can optionally include that the plurality of gate electrodes includes a polysilicon material.

In example 17, the subject matter of examples 11-16 can optionally include a plurality of conductive lines over the plurality of conductive contacts.

In example 18, the subject matter of examples 11-17 can optionally include that the first conductive region is a cathode region, wherein the second conductive region is an anode region, and wherein the first fin region has an interface sidewall that is directly adjacent and coupled to an interface sidewall of the second fin region.

In example 19, the subject matter of examples 11-18 can optionally include that the first and second conductive vias have a top surface that is substantially coplanar to a top surface of the plurality of first and second portions of the first and second fin regions.

In example 20, the subject matter of examples 11-19 can optionally include that the first conductive via is conductively coupled to the cathode region, wherein the second conductive via is conductive coupled to the anode region, and wherein the interface sidewalls of the first and second fin regions is positioned over the insulator region.

Example 21 is a transistor device, comprising: a first fin region over an insulator region, wherein the first fin region has a first sidewall and a second sidewall that is opposite to the first sidewall; a second fin region over a first conductive region and the insulator region, wherein the second fin region is laterally adjacent to the first sidewall of the first fin region; a third fin region over a second conductive region and the insulator region, wherein the third fin region is laterally adjacent to the second sidewall of the first fin region, wherein the first fin region is surrounded by the second fin region and the third fin region, and wherein the insulator region is between the first conductive region and the second conductive region; a fourth fin region over a third conductive region; a first conductive via on the first conductive region, wherein the first conductive via is vertically adjacent to the second fin region; a second conductive via on the second conductive region, wherein the second conductive via is vertically adjacent to the third fin region; and a third conductive via on the third conductive region, wherein the third conductive via is vertically positioned in between the fourth fin region.

In example 22, the subject matter of example 21 can optionally include a plurality of first portions on the first and fourth fin regions; a plurality of second portions on the second and third fin regions; a plurality of gate electrodes over the first, second, third, and fourth fin regions, wherein the plurality of gate electrodes are between the plurality of first and second portions; a plurality of conductive contacts over the plurality of first and second portions and the first, second, third, and fourth fin regions, wherein the plurality of gate electrodes are between the plurality of conductive contacts, wherein the first, second, and third conductive vias are coupled to the plurality of conductive contacts; and a plurality of conductive lines over the plurality of conductive contacts.

In example 23, the subject matter of examples 21-22 can optionally include that the first and fourth fin regions include a first N-type doped material, and wherein the second and third fin region includes a first P-type doped material, wherein the first conductive region is an emitter region, wherein the second conductive region is a collector region, and wherein the third conductive region is a base region.

In example 24, the subject matter of examples 21-23 can optionally include that the plurality of first portions includes a second N-type doped material, wherein the plurality of second portions includes a second P-type doped material, wherein the plurality of gate electrodes includes a polysilicon material, and wherein the first, second, and third conductive vias have a top surface that is substantially coplanar to a top surface of the plurality of conductive contacts.

In example 25, the subject matter of examples 21-24 can optionally include that the first conductive via is conductively coupled to the emitter region, wherein the second conductive via is conductively coupled to the collector region, wherein the third conductive via is conductively coupled to the base region, wherein one of the plurality of conductive lines conductively couples the first fin region to the fourth fin region, and wherein the base region is separated from the emitter and collector regions.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:
1. A diode device, comprising:
 a first fin region over a first conductive region and an insulator region;
 a second fin region over a second conductive region and the insulator region, wherein the second fin region is laterally adjacent to the first fin region, and wherein the insulator region is between the first conductive region and the second conductive region;

a first conductive via on the first conductive region, wherein the first conductive via is vertically adjacent to the first fin region; and a second conductive via on the second conductive region, wherein the second conductive via is vertically adjacent to the second fin region.

2. The diode device of claim 1, further comprising:

a plurality of first portions on the first fin region;

a plurality of second portions on the second fin region;

a plurality of gate electrodes over the first and second fin regions, wherein the plurality of gate electrodes are between the plurality of first and second portions; and a plurality of conductive contacts over the plurality of first and second portions and the first and second fin regions, wherein the plurality of gate electrodes are between the plurality of conductive contacts.

3. The diode device of claim 2, wherein the first and second conductive vias are coupled to the plurality of conductive contacts.

4. The diode device of claim 1, wherein the first fin region includes a first N-type doped material, and wherein the second fin region includes a first P-type doped material.

5. The diode device of claim 2, wherein the plurality of first portions includes a second N-type doped material, and wherein the plurality of second portions includes a second P-type doped material.

6. The diode device of claim 2, wherein the plurality of gate electrodes includes a polysilicon material.

7. The diode device of claim 2, further comprising a plurality of conductive lines over the plurality of conductive contacts.

8. The diode device of claim 1, wherein the first conductive region is a cathode region, wherein the second conductive region is an anode region, and wherein the first fin region has an interface sidewall that is directly adjacent and coupled to an interface sidewall of the second fin region.

9. The diode device of claim 2, wherein the first and second conductive vias have a top surface that is substantially coplanar to a top surface of the plurality of conductive contacts.

10. The diode device of claim 8, wherein the first conductive via is conductively coupled to the cathode region, wherein the second conductive via is conductive coupled to the anode region, and wherein the interface sidewalls of the first and second fin regions are positioned over the insulator region.

* * * * *